(12) United States Patent
Mori et al.

(10) Patent No.: US 9,423,118 B2
(45) Date of Patent: Aug. 23, 2016

(54) LIGHT-EMITTING MODULE AND LAMP USING SAME

(71) Applicant: PANASONIC CORPORATION, Osaka (JP)

(72) Inventors: Toshio Mori, Kyoto (JP); Ikuko Aoki, Osaka (JP); Kazuyuki Okano, Osaka (JP); Makoto Horiuchi, Nara (JP); Takaari Uemoto, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 262 days.

(21) Appl. No.: 13/980,960

(22) PCT Filed: Nov. 14, 2012

(86) PCT No.: PCT/JP2012/007300
§ 371 (c)(1),
(2) Date: Jul. 22, 2013

(87) PCT Pub. No.: WO2013/073181
PCT Pub. Date: May 23, 2013

(65) Prior Publication Data
US 2014/0078738 A1   Mar. 20, 2014

(30) Foreign Application Priority Data

Nov. 15, 2011   (JP) .................................. 2011-249860

(51) Int. Cl.
*F21V 29/00*   (2015.01)
*H01L 25/075*   (2006.01)
(Continued)

(52) U.S. Cl.
CPC . *F21V 29/24* (2013.01); *F21V 9/08* (2013.01); *F21V 13/02* (2013.01); *F21V 29/85* (2015.01);
(Continued)

(58) Field of Classification Search
CPC ............ F21V 29/24; F21V 9/08; F21V 13/02
USPC ........................ 362/249.02, 293, 311.03, 382
See application file for complete search history.

(56) References Cited

U.S. PATENT DOCUMENTS

2006/0227558 A1   10/2006   Osawa et al.
2007/0115686 A1*   5/2007   Tyberghien ................... 362/580
(Continued)

FOREIGN PATENT DOCUMENTS

EP   1928978   6/2008
EP   2113949   11/2009
(Continued)

OTHER PUBLICATIONS

International Search Report, mail date is Feb. 12, 2013.
(Continued)

*Primary Examiner* — Andrew Coughlin
*Assistant Examiner* — Meghan Ulanday
(74) *Attorney, Agent, or Firm* — Greenblum & Bernstein, P.L.C.

(57) ABSTRACT

A light-emitting module includes a substrate, an LED chip arranged on a main surface of the substrate, a sealing member covering the LED chip on the main surface of the substrate and converting a wavelength of the light produced by the LED chip, and a heat transfer member thermally connecting the sides of the LED chip to the main surface of the substrate and dissipating heat produced by the LED chip to the substrate. The heat transfer member is made up of a silicone resin having particles dispersed therein, the particles being nanoparticles of $ZrO_2$ and microparticles of $MgO$, which have higher thermal conductivity than the silicone resin.

18 Claims, 22 Drawing Sheets

(51) Int. Cl.
*H01L 33/56* (2010.01)
*H01L 33/64* (2010.01)
*F21V 9/08* (2006.01)
*F21V 13/02* (2006.01)
*F21V 29/85* (2015.01)
*F21K 99/00* (2016.01)
*F21Y 101/02* (2006.01)
*F21V 3/04* (2006.01)
*F21V 23/00* (2015.01)
*H01L 33/62* (2010.01)

(52) U.S. Cl.
CPC ............ *H01L 25/0753* (2013.01); *H01L 33/56* (2013.01); *H01L 33/641* (2013.01); *F21K 9/135* (2013.01); *F21K 9/56* (2013.01); *F21V 3/0481* (2013.01); *F21V 23/002* (2013.01); *F21Y 2101/02* (2013.01); *H01L 33/62* (2013.01); *H01L 33/642* (2013.01); *H01L 2224/48091* (2013.01); *H01L 2224/48137* (2013.01); *H01L 2224/73265* (2013.01); *H01L 2224/83951* (2013.01); *H01L 2224/8592* (2013.01); *H01L 2924/181* (2013.01); *H01L 2933/0091* (2013.01)

(56) References Cited

U.S. PATENT DOCUMENTS

| | | |
|---|---|---|
| 2010/0237761 A1 | 9/2010 | Osawa et al. |
| 2010/0237779 A1 | 9/2010 | Osawa et al. |
| 2010/0244650 A1 | 9/2010 | Osawa et al. |
| 2010/0244694 A1 | 9/2010 | Osawa et al. |
| 2010/0253200 A1 | 10/2010 | Osawa et al. |
| 2011/0156569 A1 | 6/2011 | Osawa et al. |
| 2011/0199021 A1 | 8/2011 | Oyaizu et al. |
| 2011/0309386 A1 | 12/2011 | Osawa et al. |
| 2011/0310606 A1 | 12/2011 | Osawa et al. |
| 2012/0044669 A1 | 2/2012 | Ogata et al. |
| 2012/0235181 A1* | 9/2012 | Matsuda et al. ............... 257/88 |
| 2012/0294005 A1 | 11/2012 | Osawa et al. |
| 2012/0294006 A1 | 11/2012 | Osawa et al. |
| 2012/0300458 A1 | 11/2012 | Osawa et al. |
| 2012/0300477 A1 | 11/2012 | Osawa et al. |

FOREIGN PATENT DOCUMENTS

| | | |
|---|---|---|
| EP | 2190664 | 6/2010 |
| JP | 07-086640 | 3/1995 |
| JP | 2000-150969 | 5/2000 |
| JP | 2006-313717 | 11/2006 |
| JP | 2008-063449 | 3/2008 |
| JP | 2009-037995 | 2/2009 |
| JP | 2010-275405 | 12/2010 |
| JP | 2011-032344 | 2/2011 |
| JP | 2011-040715 | 2/2011 |
| JP | 2011-119292 | 6/2011 |
| JP | 2011-171320 | 9/2011 |
| JP | 2012-229317 | 11/2012 |
| WO | 2007/027618 | 3/2007 |
| WO | 2009/031084 | 3/2009 |
| WO | 2011/111399 | 9/2011 |

OTHER PUBLICATIONS

Search report from E.P.O., mail date is May 8, 2015.

* cited by examiner

| | Refractive Index |
|---|---|
| ZnO | 1.95 |
| MgO | 1.72 |
| Sapphire | 1.75 |
| Al₂O₃ | 1.58-1.76 |
| Y₂O₃ | 1.82 |
| TiO₂ | 2.52-2.71 |
| ZrO₂ | 2.4 |
| Silicone | 1.4 |

LIGHT-EMITTING MODULE AND LAMP USING SAME

TECHNICAL FIELD

The present invention pertains to a light-emitting module using a semiconductor light-emitting element, and in particular to technology for improving thermal dissipation therein.

BACKGROUND ART

In recent years, semiconductor light-emitting elements such as light-emitting diodes (hereinafter, LEDs) have been expected to become a new light source for lamps, due to their high efficiency and long useful life in comparison to incandescent and halogen light bulbs. The light output of such LED chips decreases as temperature increases. Accordingly, constraining temperature increases is an important concern in a lamp using the LED chips.

Conventional lamps have been proposed in which temperature increases are constrained for the LED chips (see Patent Literature 1 and 2).

The lamps described in Patent Literature 1 and 2 each include a substrate, a light-emitting module made up of a plurality of LED chips mounted on the substrate, a mount on which the light-emitting module is mounted, and a case holding the mount therein such that a part of the lamp remains exposed. The mount and the case are formed as a common whole. In these lamps, heat is produced by the LED chips and transferred through the mount and then effectively transferred to the case, thus constraining temperature increases of the LED chips.

Generally, these lamps use a light-emitting module in which the LED chips are affixed to the substrate by an adhesive made of silicone resin. As such, the heat produced by the LED chips is transferred to the substrate via the adhesive made of silicone resin.

CITATION LIST

Patent Literature

[Patent Literature 1]
Japanese Patent Application Publication No. 2006-313717
[Patent Literature 2]
Japanese Patent Application Publication No. 2009-037995

SUMMARY OF INVENTION

Technical Problem

However, in recent years, demand for high-brightness lamps has increased, leading to high-output LED chips being used. As such, large amounts of heat are produced by these high-output LED chips.

However, the lamps described in Patent Literature 1 and 2 have not benefited from improvements to the heat transfer properties of the adhesive attaching the LED chips to the substrate. Accordingly, insufficient heat transfer occurs between the LED chips and the substrate, leading to a risk that the temperature increases of the LED chips are not sufficiently constrained.

In consideration of the above-described situation, the present invention aims to provide a light-emitting module that provides improvements to the heat transfer properties of semiconductor light-emitting elements.

Solution to Problem

In order to solve the above-described problem, a light-emitting module pertaining to the present disclosure comprises: a substrate; a semiconductor light-emitting element arranged on a main surface of the substrate; a wavelength conversion member disposed on the main surface of the substrate so as cover the semiconductor light-emitting element and converting a wavelength of light radiating from the semiconductor light-emitting element, and a heat transfer member thermally connecting at least a portion of an outer circumferential surface of the semiconductor light-emitting element with the main surface of the substrate, and transferring heat produced by the semiconductor light-emitting element to the substrate, wherein the heat transfer member includes a base material that is optically transmissive, and particles of an optically transmissive material that are dispersed within the base material and have higher thermal conductivity than the base material.

Advantageous Effect of Invention

According to this configuration, the light-emitting module includes a heat transfer member thermally connecting at least a portion of the outer circumferential surface of the semiconductor light-emitting element with the main surface of the substrate, and transferring heat produced by the semiconductor light-emitting element to the substrate, while the heat transfer member includes a base material that is optically transmissive, and particles of an optically transmissive material that are dispersed within the base material and have higher thermal conductivity than the base material. Thus, heat produced by the semiconductor light-emitting element is more effectively transferred to the substrate via the heat transfer member in comparison with a configuration in which the heat transfer member only includes the base material. Accordingly, constraints on temperature increases in the semiconductor light-emitting element are promoted.

Also, the heat transfer member is made of an optically transmissive base material and of particles that are dispersed throughout the base material, are optically transmissive, and have higher thermal conductivity than the base material. Thus, the light emitted by the semiconductor light-emitting element is not obstructed by the heat transfer member and is prevented from decreasing in output efficacy. Furthermore, the configuration in which the heat transfer member is made of a base material and particles having greater thermal conductivity than the base material provides an additional degree of freedom to heat transfer member design.

BRIEF DESCRIPTION OF DRAWINGS

FIG. 1A shows a plan view, FIG. 1B shows a cross-section taken along chained line A-A' in the direction of the arrows, FIG. 1C shows a magnified cross-section of the area encircled by chained line A1, and FIG. 1D shows a cross-section taken along line B-B' in the direction of the arrows.

FIG. 2A-2 is a thermal circuit diagram describing heat dissipation characteristics of the light-emitting module pertaining to the comparative example, FIG. 2B-1 shows a partial cross-section of a light-emitting module pertaining to Embodiment 1, and FIG. 2B-2 is a thermal circuit diagram describing heat dissipation characteristics of the light-emitting module pertaining to Embodiment 1.

FIG. 9A shows a plan view, FIG. 9B shows a plan view of the area outlined by dashed line A2 in FIG. 9A without the sealing member, and FIG. 9C shows a partial cross-section.

FIG. 10A is a perspective view and FIG. 10B is a cross-section.

FIG. 20A shows a plan view with a sealing member partially removed and FIG. 20B is a partial cross-section.

DESCRIPTION OF EMBODIMENTS

Embodiment 1

(1) Overall Configuration

Figure 1A:
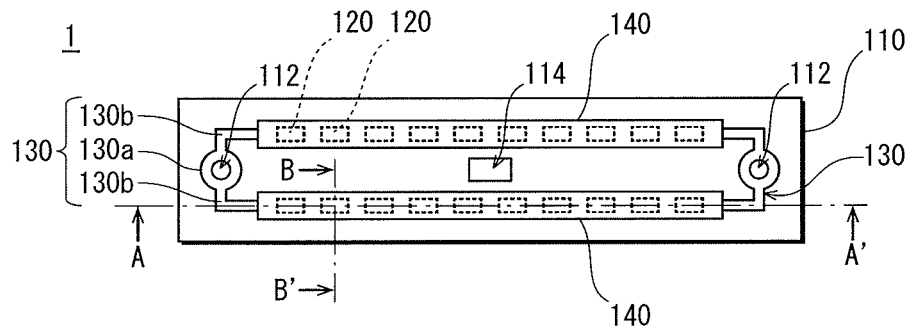
FIGS. 1A through 1D show a light-emitting module pertaining to Embodiment 1, where
Figure 1B:
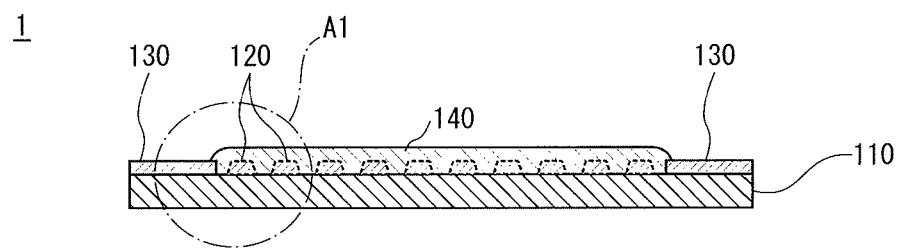
Figure 1C:
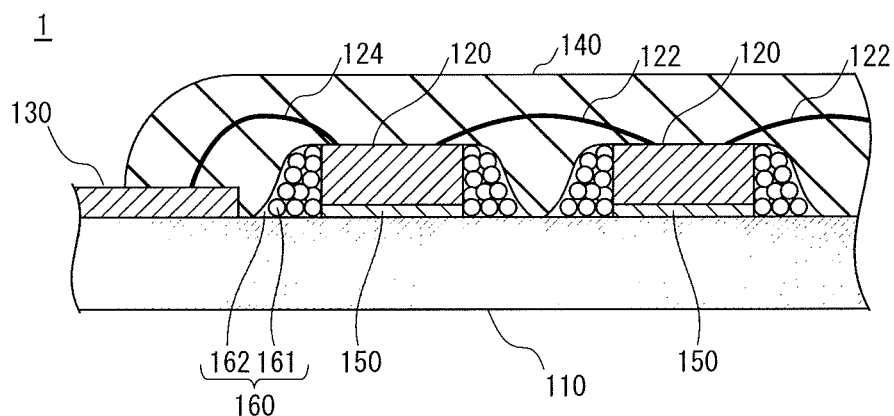

FIG. 1A shows a plan view of a light-emitting module 1 pertaining to the present Embodiment. FIG. 1B is a cross-sectional view taken along line A-A' of FIG. 1A, and FIG. 1C is a magnified view of an encircled portion A1 of FIG. 1B.

As shown in FIG. 1A, the light-emitting module 1 includes a substrate 110, a plurality of LED chips (i.e., semiconductor light-emitting elements) 120 arranged in two rows on the substrate 110, a wiring pattern 130 for supplying electric power to each LED chip 120, and a sealing member 140 sealing the LED chips 120 into row units. Also, as shown in FIG. 1C, the light-emitting module 1 has die attach members 150 for attaching each LED chip 120 to the substrate 110, and a heat transfer member 160 for dissipating heat produced by the LED chips 120 to the substrate 110.

(1-1) Substrate

As shown in FIG. 1A, the substrate 110 is rectangular in a plan view, and has through-holes 112 formed at each longitudinal end for connecting leads supplying power from a power source circuit to the LED chips 120. Also, a through-hole 114 is formed at the approximate centre of the substrate 110 for the sake of convenience when fixing the substrate 110 to a heat sink or the like. The substrate 110 is not limited to being rectangular in a plan view, and may instead be elliptical or polygonal. Further, the through-holes 112 and 114 may or may not be formed therein.

The substrate 110 is, for example, formed of a ceramic material that is highly thermoconductive and has excellent heat dissipation properties. Also, the substrate 110 is transparent to visible light. Accordingly, despite the LED chips 120 being mounted on only one side of the substrate 110, light radiating from the LED chips 120 is also emitted through the far side, with respect to the thickness dimension of the substrate 110. As such, omnidirectional flux distribution is achieved. Aluminium oxide ($Al_2O_3$), which is a ceramic material having 96% optical transmissiveness, is usable as the material for the substrate 110. The material for the substrate 110 is not limited to a ceramic, but may also be resin or glass. Also, a metal material (such as aluminium) may be used when flux distribution is not a consideration.

(2-2) LED Chip

As shown in FIG. 1A, the LED chips 120 include twenty LED chips 120 arranged longitudinally on the substrate 110 to form two element rows. The element rows are disposed in parallel along the longitudinal direction of the substrate 110 so as to sandwich through-hole 112. The LED chips 120 are not limited to being twenty in number. The number of LED chips may be adjusted according to the usage mode of the light-emitting module 1. Also, the LED chips 120 may be arranged into a single element row, or may be arranged into three or more element rows.

As shown in FIG. 1B, each LED chip 120 is a surface mounted LED (i.e., chip-on-board, hereinafter COB). Also, as shown in FIG. 1C, an electrode (not diagrammed) is disposed over the top face of each LED chip 120. The LED chips 120 are connected in series by metal wires 122 that link the electrodes of neighbouring LED chips 120.

Each LED chip 120 emits blue light and is formed of GaN (gallium nitride) material An individual LED chip 120 emits light from an active layer formed of a semiconductor sandwiched between an N-type semiconductor cladding layer and a P-type semiconductor cladding layer. Further, each LED chip 120 is cuboid in shape. The light emitted by the active layer of each LED chip 120 radiates outward not only from the top and bottom faces of the LED chip 120, but also from the four side faces thereof. That is, the light-emitting surface of each LED chip 120 includes the top face, the bottom face, and the four side faces. In addition, each LED chip 120 produces heat as well as light.

(1-3) Wiring Pattern

As shown in FIG. 1A, the wiring pattern 130 is formed at each longitudinal end of the substrate 110. The wiring pattern 130 is made up of a land portion 130a disposed on the substrate 110 at the outer circumference of through-hole 112, and two leg portions 130b formed on the substrate 110 so as to respectively extend from one of the latitudinal sides of the land portion 130a along two neighbouring edges of the substrate 110. The two element rows are then disposed between the portions of the wiring pattern 130 formed at each longitudinal end of the substrate 110. Here, the land portions 130a of the wiring pattern 130 are electrically connected to the lead passing through each of the through-holes 112 in the substrate 110, by means of solder or the like. One of the two portions of the wiring pattern 130 is connected to an output terminal on the high-potential side of the power source circuit, while the other portion is connected to an output terminal on the low-potential side of the power source circuit. The wiring pattern 130 is formed from an electrically conductive material, such as Ag (silver), W (tungsten), Cu (copper), ITO (Indium-Tin Oxide) or similar. Also, as shown in FIG. 1C, the leg portions 130b in the wiring pattern 130 and the LED chip 120 are electrically connected by the metal wire 124.

A Ni (nickel), Au (gold), or similar plating process may be applied to the surface of the wiring pattern. Likewise, a coating of glass or the like may be applied to surface of the wiring pattern, with the exception of land portions 130a and the ends of the leg portions 130b opposite the ends thereof connected to the land portion 130a (i.e., at a position bonded to the end of the metal wire 124). Further, one of the two portions of the wiring pattern 130 may be grounded.

(1-4) Sealing Member

As shown in FIG. 1A, the sealing member 140 is formed along the longitudinal direction of the substrate 110 so as to cover each of the two element rows described above. The sealing member 140 is formed of an optically transmissive resin material that contains fluorescent particles. The sealing member 140 serves as a wavelength conversion member that changes the wavelength of the light emitted by the LED chips 120.

The optically transmissive resin material may be, for example, a silicone resin, a fluorine resin, a silicone-epoxy hybrid resin, a urea-formaldehyde resin, an epoxy resin, a urethane resin, an acrylic resin, a polycarbonate resin, and so on. The material used for the sealing member 140 is not limited to being an optically transmissive resin, but may also be glass or similar material having $SiO_2$ or the like as a principal component. Alternatively, the material for the sealing member may be an organic-inorganic hybrid translucent body. The organic-inorganic hybrid translucent body is made of glass and resin.

The fluorescent particles are, for example, pulverized YAG fluorescent particles (($Y, Gd)_3Al_5O_{12}:Ce^{3+}$), silicate fluorescent particles (($Sr, Ba)_2SiO_4:Eu^{2+}$), nitride fluorescent particles (($Ca, Sr, Ba)AlSiN_3:Eu^{2+}$), or oxynitride fluorescent particles ($Ba_3Si_6O_{12}N_2:Eu^{2+}$). Accordingly, the blue light radiating from the LED chips 120 is partially converted by the fluorescent particles into yellow light, which is emitted in combination with the blue light to produce white light. The sealing member 140 need not necessarily include the fluorescent particles. Also, the LED chips 120 are protected against degradation as a result of being sealed by the sealing member 140.

(1-5) Die Attach Member

Figure 1D:
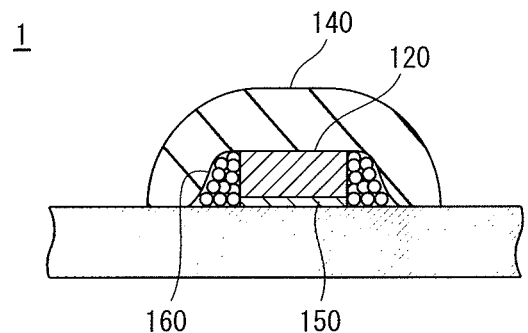

As shown in FIGS. 1C and 1D, a die attach member 150 is interposed between each LED chip 120 and the main surface of the substrate 110, and serves to affix each LED chip 120 to the substrate 110. The die attach member 150 is, for example, made from an adhesive that includes an optically transmissive thermoconductive resin, such as silicone resin. As such, the die attach member 150, being optically transmissive, propagates light emitted from the bottom face of the LED chip 120 mounted thereon to the inside of the substrate 110.

The thermal resistance of the die attach member 150 is calculated according to Math. 1, below.

[Math. 1]

$$RthD = \frac{TD}{SD \times \kappa D} \quad \text{(Math. 1)}$$

Here, RthD is the thermal resistance of the die attach member 150, TD is the thickness of the die attach member 150, SD is the cross-sectional area of the die attach member 150, and κD is the thermal conductivity of the die attach member 150.

For example, when the die attach member 150 has external dimensions of 365 μm×365 μm×2 μm and is made of silicone resin, then given that the thermal conductivity of silicone resin is 0.15 W/m·K, Math. 1 gives the thermal resistance of the die attach member 150 as approximately 100 K/W.

(1-6) Heat Transfer Member

The heat transfer member 160 serves to dissipate the heat produced by the LED chips 120 emitting light to the substrate 110. As shown in FIGS. 1C and 1D, the heat transfer member 160 is disposed on the substrate 110 at an outer circumferential area of each LED chip 120, adheres to the four side faces of each LED chip 120, and thermally connects each LED chip 120 to the substrate 110. Above, thermally connecting refers to creating a state in which the two components so connected are able to transfer heat from one to the other. No connection exists between the heat transfer members 160 disposed at the outer circumferential area of two neighbouring LED chips 120.

The heat transfer member 160 is made up of an optically transmissive base material having particles of a highly optically transmissive material dispersed therein, which has higher thermal conductivity than the base material. Specifically, the heat transfer member 160 is formed of a composite material 162, which includes silicone resin as the optically transmissive base material and nanoparticles dispersed in the silicone material, and of microparticles 161. The nanoparticles and microparticles are particles of a highly optically transmissive material having higher thermal conductivity than the base material. The composite material 162 is hereinafter termed a nanocomposite. The nanocomposite 162 serves to contain the microparticles 161. The nanoparticles are particles having an average diameter that is equal to or less than the 450 nm wavelength of blue light. The microparticles 161 are particles having an average diameter of 1 μm to 100 μM inclusive, which is greater than the 660 nm wavelength of red light. The material for the nanoparticles and the microparticles 161 is, for example, any of ZnO, MgO, sapphire, $Al_2O_3$, $Y_2O_3$, $TiO_2$, and $ZrO_2$. As mentioned, the nanoparticles and microparticles are formed of an optically transmissive material. However, this excludes the fluorescent particles. Accordingly, the light radiating from the LED chips 120 does not undergo wavelength conversion upon passing through the heat transfer member 160. Configuring the heat transfer member 160 such that no wavelength conversion occurs therein enables the colour of the light emitted from the light-emitting module 1 to be determined solely according to the colour of the light emitted from the LED chips 120 and the colour of the light converted by the sealing member 140. As such, the colour of the light emitted by the light-emitting module 1 is beneficially made easier to adjust.

Considering that the wavelength band of visible light is greater than 450 nm and less than 750 nm, the average diameter of the microparticles 161 is greater than the wavelength of visible light, and the average diameter of the nanoparticles is smaller than the wavelength of visible light.

The aforementioned sapphire has a thermal conductivity of 42 W/m·K, the Al$_2$O$_3$ has a thermal conductivity of 36 W/m·K, the Y$_2$O$_3$ has a thermal conductivity of 11 W/m·K, the ZnO and the MgO both have a thermal conductivity of 54 W/m·K, and the ZrO$_2$ has a thermal conductivity of 3.0 W/m·K. All of the above ceramic materials have a thermal conductivity that is greater than that of silicone resin, which is 0.15 W/m·K. These ceramics may be used as the materials for the microparticles 161 and the nanoparticles within the heat transfer member 160. For instance, the microparticles 161 may be formed of MgO and the nanoparticles may be formed of ZrO$_2$. In such circumstances, the MgO making up the microparticles 161 has higher thermal conductivity than the ZrO$_2$ making up the nanoparticles.

The microparticles 161 may include a plurality of particle types each having a different average diameter. For instance, when two types of microparticles that differ in average diameter are used, the type of microparticle having the smaller average diameter (hereinafter, small microparticles) are beneficially no larger than a gap formed between neighbouring particles of the type having the larger average diameter (hereinafter, large microparticles) when the large microparticles are packed as densely as possible into the heat transfer member 160. Accordingly, the microparticle 161 packing density within the heat transfer member 160 is increased, thus enabling improvements in heat transfer from the LED chip 120 to the substrate 110.

The average diameter of the microparticles 161 and the nanoparticles is measured using dynamic light scattering (e.g., measured using the nanotrac-UT 151 from Nikkiso Co. Ltd.). The nanoparticles are then measured by mixing into an organic solvent or similar in which the nanoparticle density is less than 30 wt %. Accurate values are unobtainable with a density of 30 wt % or greater due to the multiple scattering effect. In the present document, the average diameter of the various particles corresponds to 50% of the cumulative particle volume, found by taking a total nanoparticle volume calculated from a particle diameter distribution obtained by measurement, and cumulatively adding the nanoparticle volumes beginning with the smallest particles. The average diameter of the microparticles 161 and the nanoparticles may also be found by breaking the heat transfer member 160 at a given position and observing the broken surface with a scanning electron microscope (hereinafter, SEM).

The heat transfer member 160 is in contact with the side faces of the LED chip 120. However, the side faces are not limited to being four in number, and may instead be one, two, or three side faces. Also, the heat transfer member 160 is not limited to being in contact with the entirety of any given side face of each LED chip 120. For instance, the heat transfer member 160 may be only in contact with a portion (e.g., a lower portion) of a side face of each LED chip 120.

(2) Heat Dissipation Properties of Light-Emitting Module

The following describes the heat dissipation pathways of the light-emitting module 1 pertaining to the present Embodiment, in contrast to the heat dissipation pathways of a light-emitting module pertaining to a comparative example.

Figures 2, 2A:
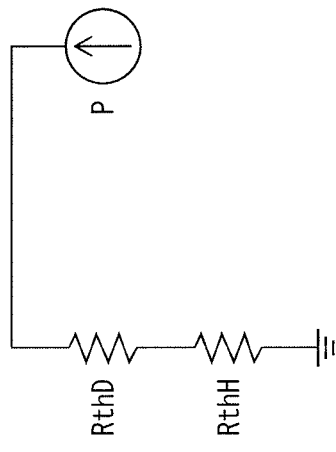
Figures 2, 2B:
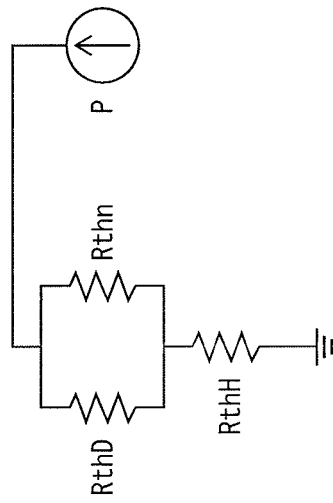
Figures 1, 2A:
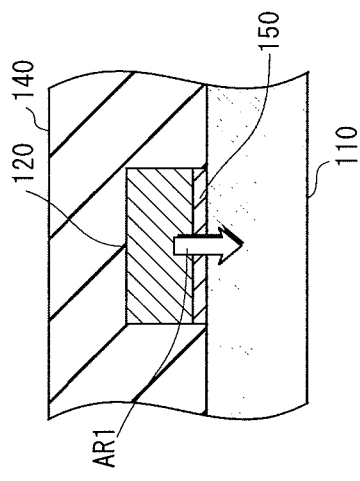
FIG. 2A-1 shows a partial cross-section of a light-emitting module pertaining to a comparative example.
Figures 1, 2B:
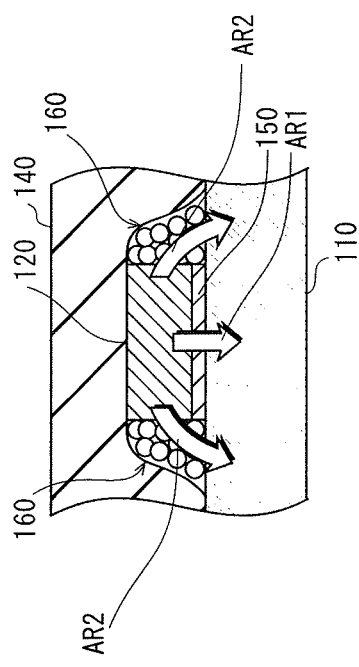

FIG. 2A-1 is a partial cross-section diagram of the light-emitting module pertaining to the comparative example, and FIG. 2A-2 is a thermal circuit diagram indicating the heat dissipation properties of the light-emitting module pertaining to the comparative example. Likewise, FIG. 2B-1 is a partial cross-section diagram of the light-emitting module 1 pertaining to the present Embodiment, and FIG. 2B-2 is a thermal circuit diagram indicating the heat dissipation properties of the light-emitting module 1 pertaining to the present Embodiment.

The light-emitting module pertaining to the comparative example is configured such that heat produced by the LED chips 120 is dissipated to the substrate 110 via a heat dissipation path passing through the die attach member 150 (see arrow AR1 in FIG. 2A-1). Accordingly, the thermal circuit diagram shown in FIG. 2A-2 is produced, where one of the LED chips 120 is the heat source P, the die attach member 150 has thermal resistance RthD, and the substrate 110 and housing enclosing the substrate 110 have thermal resistance RthH.

Conversely, as shown in FIG. 2B-1, the light-emitting module 1 is configured such that the heat produced by the LED chips 120 is dissipated to the substrate 110 via a heat dissipation path passing through the die attach member 150 (see arrow AR1 of FIG. 2B-1) and via an additional heat dissipation path passing through the heat transfer member 160 (see arrow AR2 of FIG. 2B-1). Accordingly, the thermal circuit diagram shown in FIG. 2B-2 is produced, in which one of the LED chips 120 is the heat source P, the die attach member 150 has thermal resistance RthD, the heat transfer member 160 has thermal resistance Rthn, and the substrate 110 and housing containing the substrate 110 have thermal resistance RthH. As shown, the thermal resistance RthD corresponding to the die attach member 150, disposed between the LED chip 120 and the substrate 110 (along with the housing thereof), and the thermal resistance Rthn corresponding to the heat transfer member 160 are connected in parallel. Accordingly, the synthetic thermal resistance of the die attach member 150 and the heat transfer member 160 is as expressed in Math. 2, below.

[Math. 2]

$$Rsyns = \frac{RthD \times Rthn}{RthD + Rthn} \qquad (\text{Math. 2})$$

Here, Rsyns is the synthetic thermal resistance, RthD is the thermal resistance of the die attach member 150, and Rthn is the thermal resistance of the heat transfer member 160.

Accordingly, the light-emitting module 1 pertaining to the present Embodiment is configurable such that the magnitude of the synthetic thermal resistance Rsyns of the die attach member 150 and the heat transfer member 160 is one-tenth of the thermal resistance RthD of the die attach member 150 alone. This is achieved by setting the thermal resistance Rthn of the heat transfer member 160 to be one-ninth of the thermal resistance RthD of the die attach member 150. For example, given a thermal resistance RthD of 100 K/W for the die attach member 150, the thermal resistance Rthn of the heat transfer member 160 is set to approximately 11 K/W.

Next, the thermal propagation path transmitting heat within the heat transfer member 160 is discussed with reference to FIGS. 3A, 3B, and 3C. The thermal propagation path is the path taken by the heat produced by the LED chips 120 until dissipated to the substrate 110.

Figure 3A:
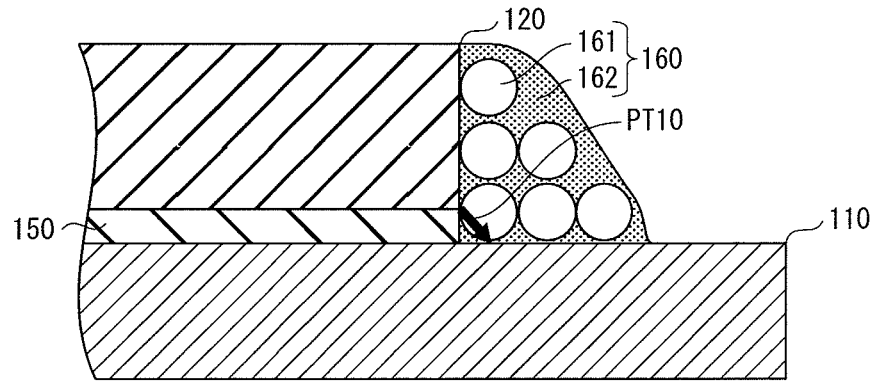
FIGS. 3A, 3B, and 3C each illustrate a thermal propagation path through the heat transfer member in the light-emitting module pertaining to Embodiment 1.

In a situation such as that illustrated by FIG. 3A, one of the microparticles 161 serves as a main thermal propagation path PT10. Thermal propagation path PT10 solely involves the microparticle 161, which has higher thermal conductivity than the nanocomposite 162.

Figure 3B:
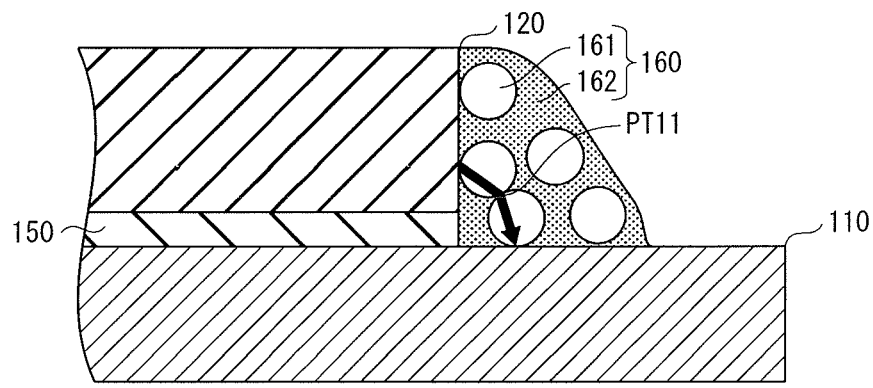

Alternatively, as shown in FIG. 3B, the microparticle 161 that is in contact with the side wall of the LED chip 120 and the microparticle 161 that is in contact with the substrate 110 may be in contact with one another. In such a case, a main thermal propagation path PT11 for the heat produced by the LED chip 120 involves entering the microparticle 161 that is in contact with the side wall of the LED chip 120, and subsequently passing through a contact portion linking the two microparticles 161 in order to enter the microparticle 161 that is in contact with the substrate 110 and reach the substrate 110. Here also, thermal propagation path PT11 solely involves microparticles 161, which have higher thermal conductivity than the nanocomposite 162.

Figure 3C:
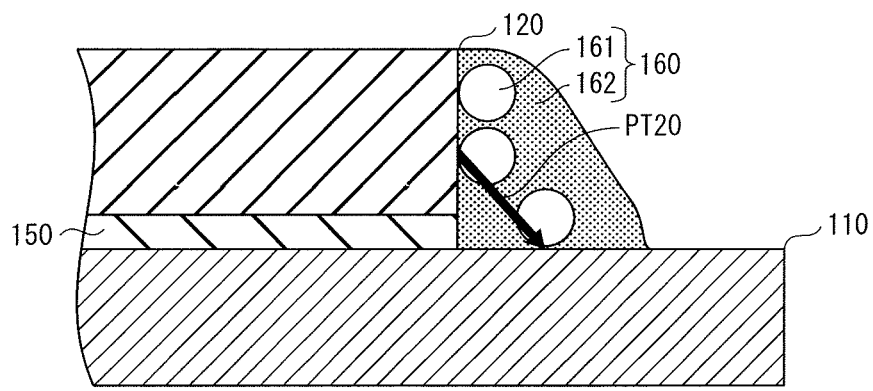

Further, as shown in FIG. 3C, a main thermal propagation path PT20 may be formed by the microparticle 161 that is in contact with the side face of the LED chip 120, a microparticle 161 that is in contact with the main surface of the substrate 110, and a portion of the nanocomposite 162 interlinking the two microparticles 161. In such a case, thermal propagation path PT20 includes a portion of the nanocomposite 162, which has lower thermal conductivity than the microparticles 161. As such, thermal propagation path PT20 is less effective at heat dissipation in comparison to thermal propagation path PT10 shown in FIG. 3A and thermal propagation path PT11 shown in FIG. 3B, due to the greater thermal resistance per unit length found therein.

Accordingly, the more microparticles 161 are contained in the heat transfer member 160, the more likely the microparticles 161 are to be in contact with each other and form a thermal propagation path that solely involves microparticles 161. Thus, the thermal resistance of the heat transfer member 160 is easily reduced.

(3) Optical Properties of Heat Transfer Member

Next, the optical properties of the heat transfer member 160 are discussed.

Figure 4A:
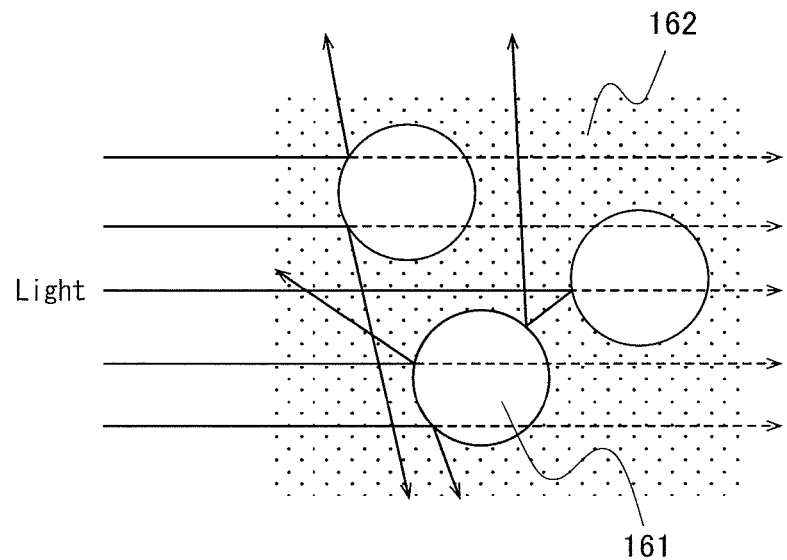
FIGS. 4A and 4B illustrate optical properties of the heat transfer member pertaining to Embodiment 1.
Figure 4B:
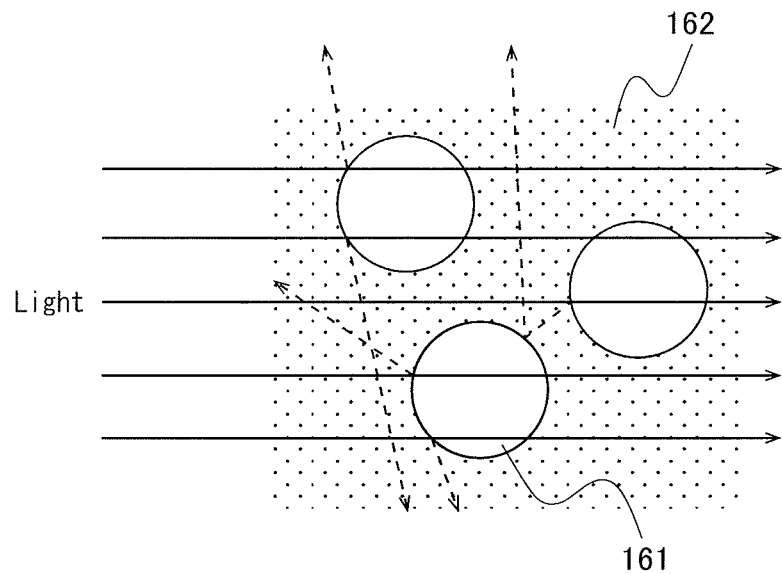

FIGS. 4A and 4B illustrate optical properties of the heat transfer member pertaining to the present Embodiment.

A portion of the light radiated by one of the LED chips 120 enters the heat transfer member 160 from the side face of the LED chip 120 and, as shown in FIGS. 4A and 4B, is transferred within the heat transfer member 160 such that a component thereof is radiated out from the heat transfer member 160.

When the refractive index of the microparticles 161 is either greater or smaller than the refractive index of the nanocomposite 162, then as shown in FIG. 4A, optical scattering occurs at the interface between the microparticles 161 and the nanocomposite 162. As a result, there is a risk that the efficiency of light extraction from the LED chip 120 may be diminished.

In contrast, when the microparticles 161 and the nanocomposite 162 have the same refractive index, then as shown in FIG. 4B, optical scattering is constrained at the interface between the microparticles 161 and the nanocomposite 162. As a result, the diminution in efficiency of light extraction from the LED chip 120 is prevented.

In the present Embodiment, the nanocomposite 162, in which the nanoparticles are dispersed within a base material, has the refractive index of the base material when the volume fraction of the nanoparticles therein is 0%, and has the refractive index of the material making up the nanoparticles when the volume fraction of the nanoparticles is 100%. The following centres on the change in refractive index as a function of change in nanoparticle volume fraction from 0% to 100%. For example, suppose that the nanoparticles are made of $ZrO_2$ and the base material is silicone resin. In such a case, the refractive index of the nanocomposite when the nanoparticle volume fraction is 0% is equal to the refractive index of silicone resin, which is 1.4, and is equal to the refractive index of $ZrO_2$, which is 2.4, when the nanoparticles volume fraction is 100%. When the nanoparticle volume fraction is between 0% and 100%, then the refractive index of the nanocomposite 162 has a value between 1.4 and 2.4.

Figures 5A, 5B:
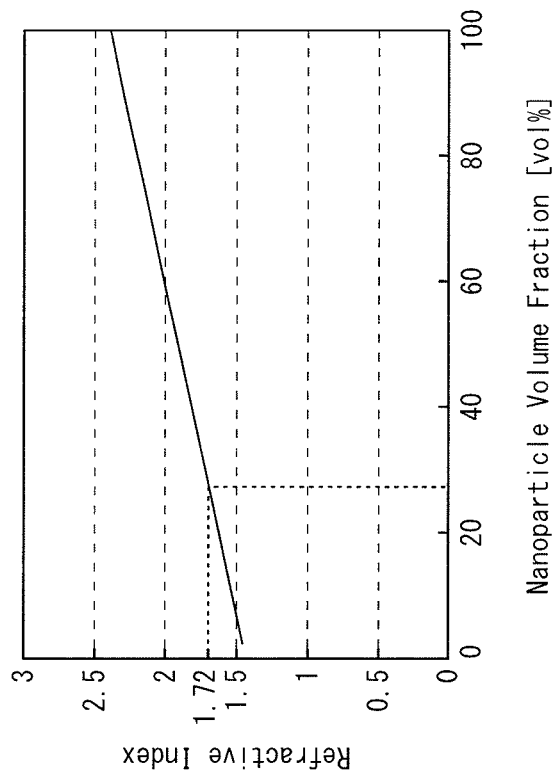
FIGS. 5A and 5B describe optical properties of the heat transfer member pertaining to Embodiment 1.

The solid line in FIG. 5A indicates the relationship between the refractive index of the nanocomposite 162 and the volume fraction of the nanoparticle made of $ZrO_2$ and dispersed within the nanocomposite 162. FIG. 5B lists the refractive index of silicone resin, $ZrO_2$, and other materials, mainly ceramics.

In the present Embodiment, the refractive index of the nanocomposite 162 that partially makes up the heat transfer member 160 is made equal to the refractive index of MgO, which makes up the microparticles 161, by adjusting the nanoparticle volume fraction in the nanocomposite 162. As shown in FIG. 5B, the refractive index of MgO is 1.72. As such, a nanoparticle volume fraction of approximately 25% suffices for the nanoparticles of $ZrO_2$ in the nanocomposite 162 (see the dashed lines of FIG. 5A).

Also, the nanocomposite 162 is prone to increasing fragility with increasing nanoparticle volume fraction. In particular, a nanoparticles volume fraction of 80% or greater increases the risk of nanocomposite 162 fragility. As such, achieving the desired refractive index by decreasing the nanoparticle volume fraction but using nanoparticles having a higher refractive index is beneficial in terms of decreasing nanocomposite 162 fragility.

Also, the nanoparticle volume fraction required to achieve equality with the refractive index of the microparticle 161 is decreased when the refractive index of the microparticles 161 is similar to the refractive index of the silicone resin. This is thus advantageous in terms of constraining nanocomposite 162 fragility.

(4) Light-Emitting Module Manufacturing Method.

FIGS. 6A through 6E are cross-sectional diagrams illustrating steps of a manufacturing method for the light-emitting module 1 pertaining to the present Embodiment.

Figure 6A:
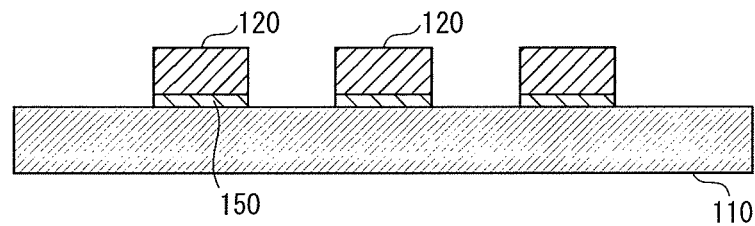
FIGS. 6A through 6E are cross-sectional diagrams illustrating steps of a manufacturing method for the light-emitting module pertaining to Embodiment 1.

Firstly, as shown in FIG. 6A, the LED chips 120 are disposed on one side of the substrate 110 with respect to the thickness dimension thereof. The LED chips 120 are then fixed to the substrate 110 by the die attach member 150. In the present Embodiment, the LED chips 120 are twenty in number.

Figure 6B:
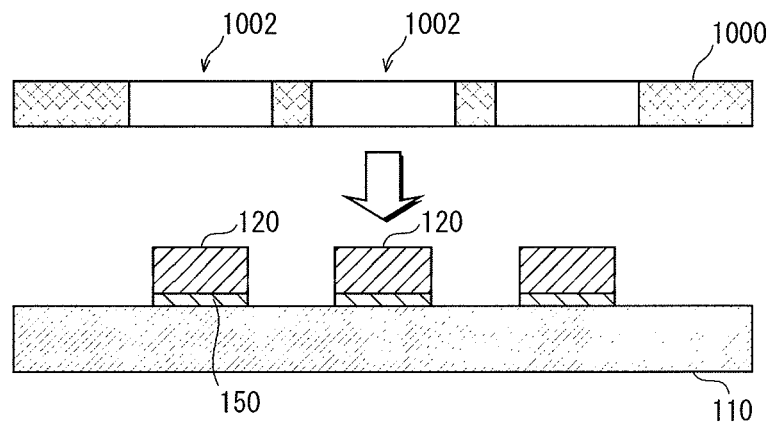

Next, as shown in FIG. 6B, a mask 1000 in which a plurality of through-holes 1002 are formed is manufactured ahead of time and prepared by disposing the mask 1000 such that the through-holes 1002 each correspond to one of the LED chips 120. The respective centres in the through-holes 1002 of the mask 1000 roughly correspond to the respective centres of the LED chips 120 disposed on the substrate 110. Also, the through-holes 1002 are approximately rectangular as seen in a plan view, and have larger external dimensions than the LED chips 120.

Next, as indicated by the arrow in FIG. 6B, the substrate 110 and the mask 1000 are affixed to each other such that the LED chips 120 are slotted into the through-holes 1002 of the mask 1000. At this point, a gap is formed between the side walls of the LED chips 120 and the inner walls of the through-hole 1002 in the mask 1000. The mask 1000 is affixed to the substrate 110 such that each through-hole 1002 surrounds one of the LED chips 120. The substrate 110 and the mask 1000 are affixed to each other by using an adhesive material (non-diagrammed) that has weaker adhesive power than the adhesive material used in making the silicone resin.

Figure 6C:
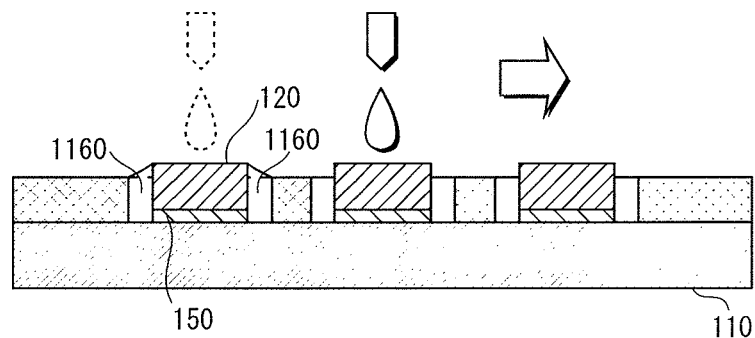

Afterward, as shown in FIG. 6C, a liquid mixture 1160 that contains of the microparticles 161 and the nanocomposite 162, which will become the heat transfer member 160, fills the gap between the side walls of the LED chips 120 and the inner walls of the through-holes 1002 in the mask 1000. The liquid mixture 1160 is produced by first blending the nanoparticles of ZnO₂ with the silicone resin, agitating the blend, then adding the microparticles 161 of MgO and agitating the resulting mixture.

The liquid mixture 1160 may be applied as shown in FIG. 6C, by using a dispenser to sequentially fill the through-holes 1002 of the mask 1000. Also, overflow of the liquid mixture 1160 from the through-hole 1002 is preventable by measuring the fill volume of the through-holes 1002 in advance and using a metered nozzle to deliver a predetermined fill volume. The fill volume is calculated according to the capacity of the through-holes 1002 and the volume of the LED chips 12.

Figure 6D:
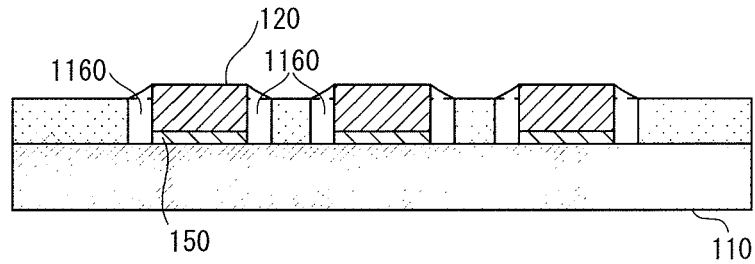
Figure 6E:
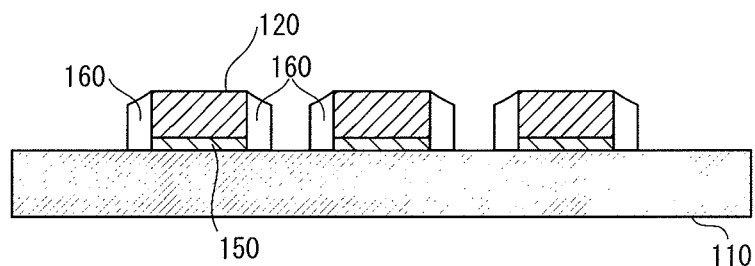

Next, as shown in FIG. 6D, the mask 1000 peels away from the substrate 110 as the liquid mixture 1160 is applied at the circumference of the LED chips 120 (see FIG. 6E). Here, the liquid mixture 1160 does not flow along the top surface of the substrate 110 due to having comparatively high viscosity.

Then, heat is applied to the entirety of the substrate 110 to form the heat transfer member 160.

Lastly, the adhesive used to affix the mask 1000 to the substrate 110 is selectively removed from the substrate 110 and the light-emitting module 1 is thus completed.

Ultimately, the light-emitting module 1 pertaining to the present Embodiment includes the heat transfer member 160, which is thermally connected to the side face of the LED chip 120 and to the main surface of the substrate 110, and serves to dissipate heat produced by the LED chip 120 to the substrate 110. As such, the heat produced by the LED chip 120 is dissipated through the heat transfer member 160 to the substrate 110, thus enhancing the constraint on temperature increases in the LED chip 120.

Also, the heat transfer member 160 is made up of optically transmissive silicone resin, a nanocomposite 162 that is dispersed throughout the silicone resin and is also optically transmissive, and optically transmissive microparticles 161. As such, the light emitted by the LED chips 120 is not blocked by the heat transfer member 160, thus preventing diminution in the efficiency of light emitted by the LED chips 120.

Furthermore, the heat transfer member 160 is made up of the nanocomposite 162 that includes the nanoparticles of ZrO₂ dispersed within the silicone resin, and of the microparticles 161. The refractive index of the microparticles 161 is freely adjustable so as to match the refractive index of the nanocomposite 162 by changing the nanoparticle volume fraction within the nanocomposite 162. Accordingly, the heat transfer member 160 gains a degree of freedom in terms of design by widening the range of materials available for use in the microparticles 161.

Embodiment 2

The following describes a light-emitting module 2 pertaining to the present Embodiment.

Figure 7:
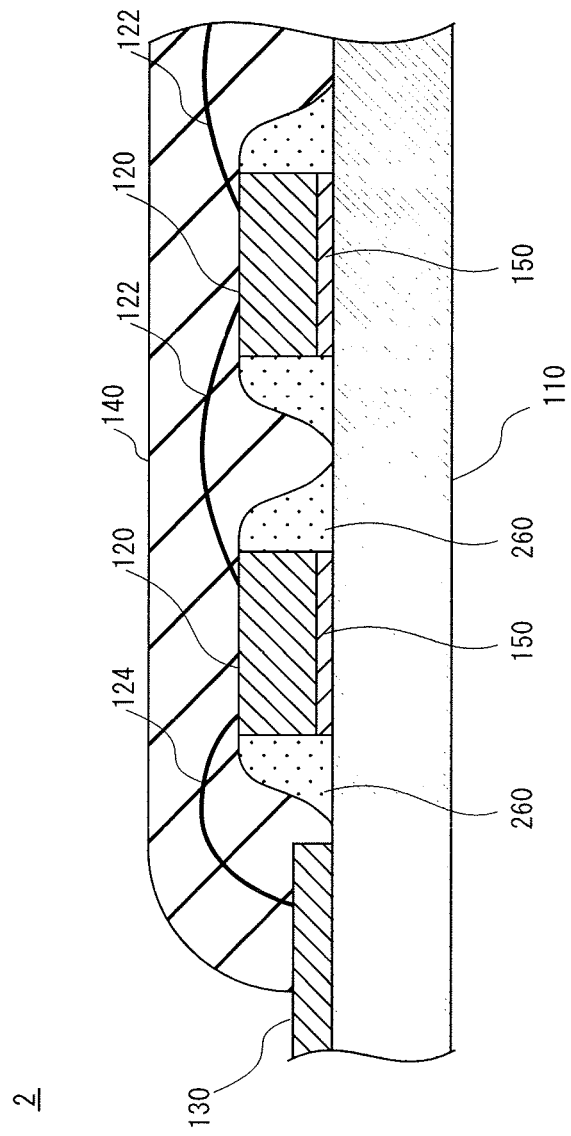
FIG. 7 shows a partial cross-section of a light-emitting module pertaining to Embodiment 2.

FIG. 7 shows a partial cross-section of a light-emitting module 2 pertaining to the present Embodiment.

As shown, light-emitting module 2 is configured similarly to the light-emitting module 1 pertaining to Embodiment 1, differing only in that the heat transfer member 260 does not include the microparticles 161 and is instead made of the nanocomposite alone. The explanation of the present Embodiment is centred on the heat transfer member 260. Components identical to those of Embodiment 1 use the same reference signs thereas, and explanations thereof are omitted.

The heat transfer member 260 serves to dissipate the heat produced by the LED chip 120 upon emitting light to the substrate 110, similar to Embodiment 1. As shown in FIG. 7, the heat transfer member 260 is disposed between the substrate 110 and the intersection of the four side walls of the LED chip 120 with the substrate 110. As such, the LED chip 120 and the substrate 110 are thermally connected.

The heat transfer member 260 is made up of the nanocomposite having nanoparticles of ZrO₂ dispersed throughout a base material of silicone resin.

Incidentally, the relationship indicated by Math. 3, below, is satisfied by the thermal conductivity of the nanocomposite and the volume fraction of nanoparticles dispersed throughout the nanocomposite.

[Math. 3]

$$1 - Vd = \frac{\kappa m - \kappa d}{\kappa c - \kappa d}\left(\frac{\kappa c}{\kappa m}\right)^{\frac{1}{3}} \quad \text{(Math. 3)}$$

Here, Vd is the nanoparticle volume fraction, κm is the thermal conductivity of the nanocomposite, κd is the thermal conductivity of the material making up the nanoparticles, and κc is the thermal conductivity of the base material.

Specifically, the thermal conductivity of the silicone resin is 0.15 W/m·K, the thermal conductivity of ZnO and MgO is 54 W/m·K, the thermal conductivity of TiO is 8.0 W/m·K, and the thermal conductivity of ZrO₂ is 3.0 W/m·K. According to these thermal conductivity values and Math. 3, the relationship between the nanoparticle volume fraction and the thermal conductivity of the nanocomposite is as indicated by the curves plotted in FIG. 8.

Figure 8:
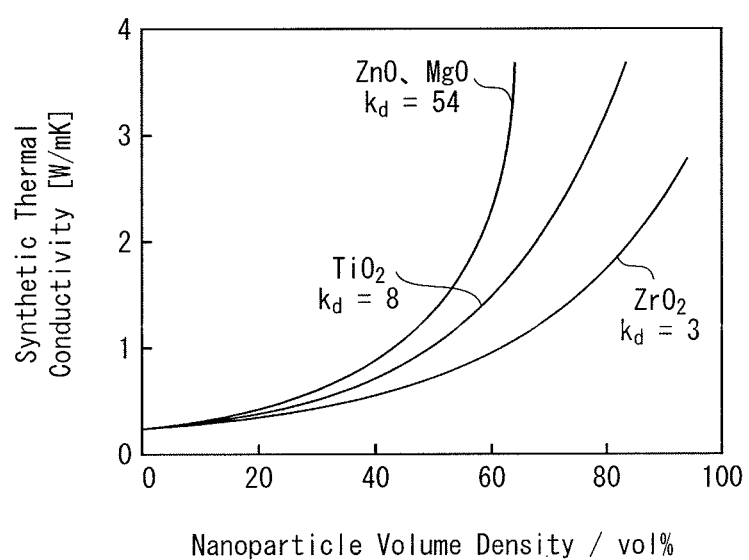
FIG. 8 describes heat dissipation properties of a heat transfer member pertaining to Embodiment 1.

As can be read from FIG. 8, using ZnO or MgO rather than ZrO₂ or TiO₂ as the material for the nanoparticles produces greater thermal conductivity with a lower volume fraction of nanoparticles. The nanocomposite grows increasingly fragile as the nanoparticle volume fraction increases. Accordingly, the material used for the nanoparticles is beneficially one that achieves a greater thermal conductivity with a lower volume fraction. Thus, for example, ZnO or MgO is beneficial in terms of light-emitting module 2 reliability.

In practice, nanoparticles made of ZrO₂ and having an average diameter of 4.0 nm are added to the silicone resin to create the nanocomposite. This is known to cause no clouding and to be optically transmissive to visible light. Such a nanocomposite is, as shown in FIG. 7, disposed such that the heat transfer member 260 is able to be in contact with each of the four side faces of the LED chip 120, which are light-emitting surfaces.

Accordingly, when the heat transfer member 260 is made of nanocomposite having nanoparticles of ZrO₂ dispersed therein, the optical efficiency produced by the LED chip 120 is maintained while providing improvements to the thermal conductivity in contrast to using silicone resin alone.

In order to reduce the synthetic thermal resistance of the die attach member 150 and the heat transfer member 260 to one-tenth of the die attach member 150 thermal resistance RthD in the light-emitting module 2, as explained above in the discussion of Math. 2, the heat transfer member 260 thermal resistance should be set to one-ninth of the die attach member 150 thermal resistance.

For example, given a thermal resistance of 2 K/W for the die attach member 150, the thermal resistance of the heat transfer member 260 is set to approximately 0.2 K/W. Here, the thermal path through the die attach member 150 has a cross-sectional area of Sd, a length of Ld, and a thermal conductivity of κd, the thermal path through the heat transfer member 260 has a cross-sectional area of Sn and a length of Ln, and the thermal conductivity of the nanocomposite making up the heat transfer member 260 is Kn. Thus, the relation of Math. 4, below, holds true.

$$\frac{Rn}{Rd} = \frac{Ln/Ld}{\kappa n/\kappa d \times Sn/Sd} \quad \text{[Math. 4]}$$

In the light-emitting module 2 pertaining to the present Embodiment, the cross-sectional area of the thermal path through the heat transfer member 260 is twice that of the thermal path through the die attach member 150. Also, the length of the thermal path through the heat transfer member 260 is four times that of the thermal path through the die attach member 150. Given these dimensions, and a die attach member 150 thermal conductivity κd of 0.15 W/m·K, then according to Math. 4, the thermal conductivity κn required for the nanocomposite making up the heat transfer member 260 is 2.7 W/m·K.

Thus, according to the relation of Math. 3, when the base material of the nanocomposite is silicone resin and the nanocomposite has a thermal conductivity κn of 2.7 W/m·K, the nanoparticle volume fraction is approximately 60% for nanoparticles made of ZnO or MgO, approximately 71% for nanoparticles made of TiO, and approximately 95% for nanoparticles made of $ZrO_2$. Given the nanocomposite fragility considerations mentioned above, ZnO and MgO are beneficial materials for the nanoparticles.

Embodiment 3

The following describes a light-emitting module 1001 pertaining to the present Embodiment. Components identical to those of Embodiment 1 use the same reference signs thereas, and explanations thereof are omitted.

Figure 9A:
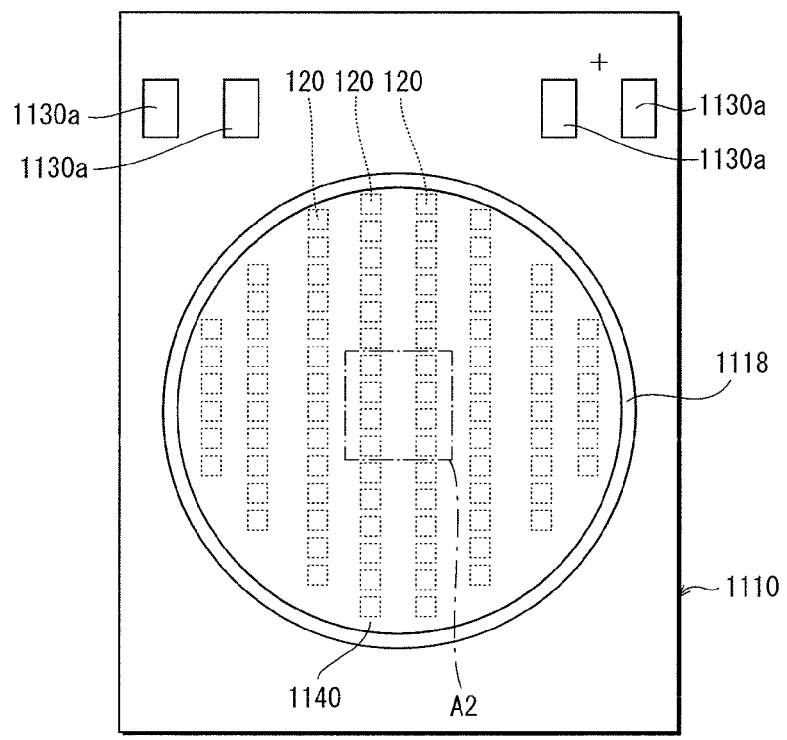
FIGS. 9A, 9B, and 9C illustrate the light-emitting module pertaining to Embodiment 3, where
Figure 9B:
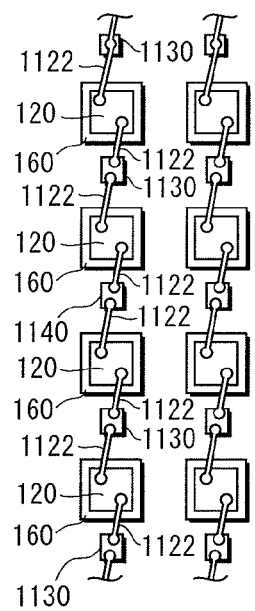
Figure 9C:
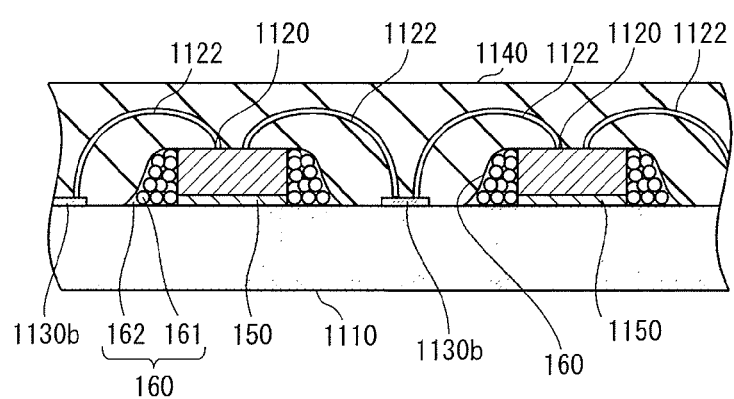

FIGS. 9A, 9B, and 9C illustrate the light-emitting module pertaining to the present Embodiment. FIG. 9A shows a plan view, FIG. 9B shows a plan view of the area outlined by dashed line A2 in FIG. 9A without the sealing member, and FIG. 9C shows a partial cross-section.

As shown, the light-emitting module 1001 includes a substrate 1110, a plurality of LED chips 120, a sealing member 1140, and a plurality of heat transfer members 160 each arranged at an outer circumferential area of one of the LED chips 120.

The substrate 1110 is a rectangular plate having a wiring pattern formed on one face thereof and having a frame 1118 formed at the approximate centre of the same face, the frame 1118 being annular in a plan view. The wiring pattern is made up of electrode pads 1130a for receiving power from an external power source, and land portions 1130b for electrically connecting two neighbouring LED chips 120. The land portions 1130b are each disposed between two neighbouring LED chips 120 with respect to a column direction (i.e., the vertical direction in FIG. 9A) within the area encircled by the frame 1118 on the main surface of the substrate 1110. The substrate 1110 is, for example, a plate made of aluminium or a similar metal material on which an insulating layer is formed from a ceramic substrate or a thermally conductive resin, thus producing a two-layer configuration.

As shown in FIG. 9A, the LED chips 120 are arranged in a matrix pattern on the main surface of the substrate 1110, such that a roughly circular pattern is formed by the whole. The LED chips 120 are not limited to being arranged as illustrated by FIG. 9A.

The LED chips 120 and the heat transfer members 160 are covered by a sealing member 1140 disposed inside the frame 1118. As shown in FIGS. 9B and 9C, the land portions 1130b and electrodes arranged on top of the LED chips 120 are electrically connected via metal wires 1122. A pair of neighbouring LED chips 120 is electrically connected by one of the land portions 1130b that is arranged at a position corresponding to the pair of LED chips 120 and by two metal wires 1122. Also, the heat transfer members 160 are arranged such that the electrodes of the LED chips 120 and a portion of the land portions 1130b and metal wires 1122 forming the wiring pattern are not covered thereby.

The present Embodiment has been described in terms of an example in which the heat transfer member 160 includes the nanocomposite 162 and the microparticles 161 described in Embodiment 1. However, no limitation is intended, and the heat transfer member 160 may instead be replaced by the heat transfer member 260 that solely includes the nanocomposite, as described in Embodiment 2.

Embodiment 4

The following describes a light-emitting module having a lamp 100 pertaining to the present Embodiment.

Figure 10A:
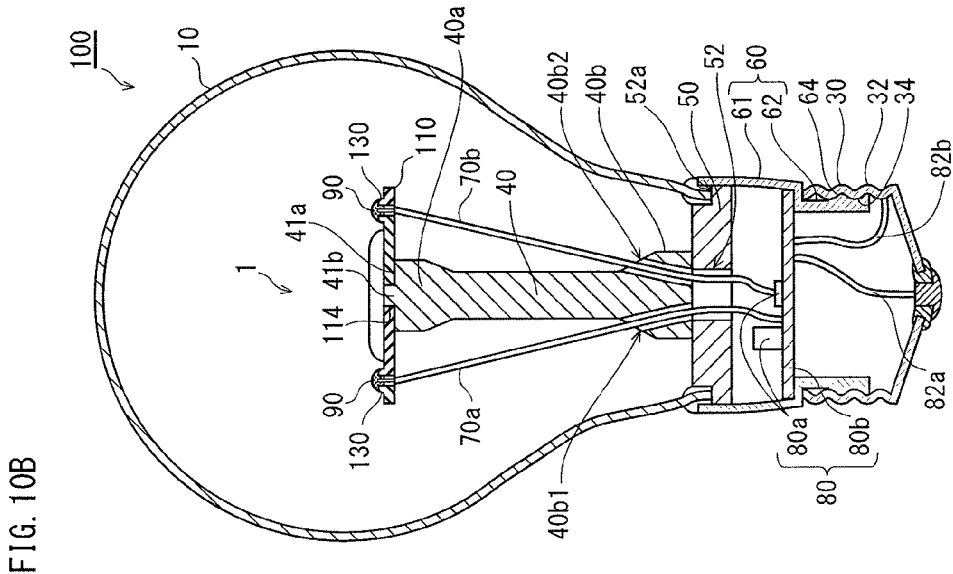
FIGS. 10A and 10B illustrate a lamp pertaining to Embodiment 3, where
Figure 10B:
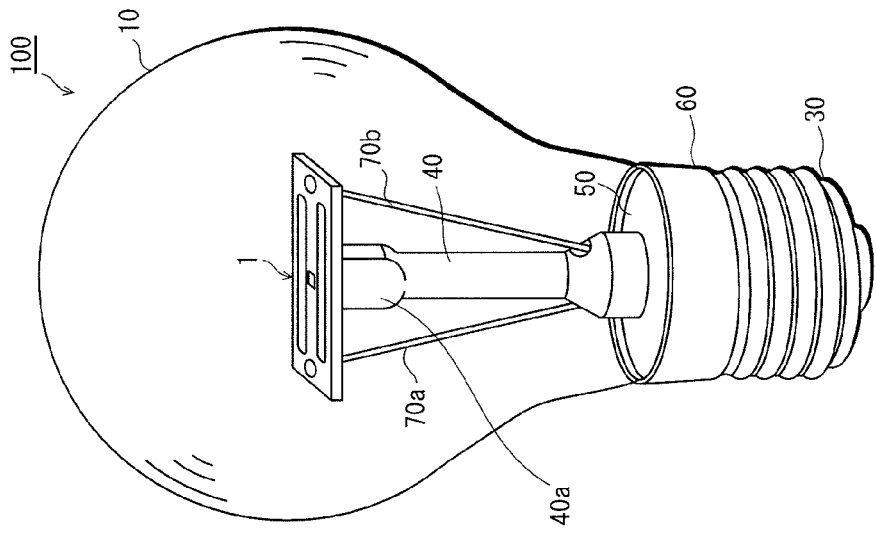

FIG. 10A shows a perspective view of the lamp 100, and FIG. 10B shows a cross-sectional view of the lamp 100.

As shown in FIG. 10A, the lamp 100 includes a light-emitting module 1 that is a light source, a globe 10 that is optically transmissive, a base 30 that receives electric power, a stem 40, a support member 50, a case 60, and a pair of leads 70a and 70b. As shown in FIG. 10B, the lamp 100 also includes a power source circuit 80 contained within the case 60.

The light-emitting module 1 serves as the light source for the lamp 100, and is disposed within the globe 10 as shown in FIG. 10A. Specifically, the light-emitting module 1 is arranged at the approximate centre of the bulb portion of the globe 10. As such, the light-emitting module 1 being arranged at the approximate centre of the bulb portion of the globe 10 enables the lamp 100 to achieve omnidirectional flux distribution that approaches that of a conventional incandescent light bulb using a filament coil.

Also, as shown in FIG. 10B, the light-emitting module 1 receives electric power from the power source circuit 80, supplied via the two leads 70a and 70b. As shown in FIG. 10B, respective ends of the two leads 70a and 70b are inserted into the through-holes 112 at each longitudinal end of the light-emitting module 1, and are thus electrically connected to the wiring pattern 130 via solder 90.

As shown in FIG. 10A, the globe 10 is shaped so as to have an enclosed bulb at one end and an opening at the other end. That is, the globe 10 is shaped as an empty bulb having a portion that narrows with increasing distance from the centre of the bulb, the opening being formed at a position farthest from the centre of the bulb. The shape of the globe 10 pertaining to the present Embodiment is the same as that of the general A-type incandescent bulb (see Japanese Industrial Standard JIS C7710). The globe 10 is made of an optically transmissive material such as silica glass, which is transparent to visible light.

The globe 10 is not limited to being shaped as an A-type bulb. For example, the globe 10 may instead be shaped as a G-type bulb or an E-type bulb. Also, the globe 10 need not necessarily be colourless. For example, the silica may be treated with a scattering process by forming an opalescent scattering film thereon. Also, red, yellow, or some other colouring may be applied, or a pattern or image may be applied, or else a reflective film may be applied to the base more than the light source, as is the case for reflector bulbs. The material for the globe 10 need not necessarily be silica glass. Acrylic or a similar optically transmissive resin may also be used.

As shown in FIG. 10B, the base 30 receives electric power supplied from a (non-diagrammed) external power source for the power source circuit 80. The electric power received by the base 30 is then supplied to the power source circuit 80 via power lines 82a and 82b.

As shown in FIG. 10A, the base 30 is shaped as a bottomed cylinder having a male helix portion 32 for screwing the base 30 into the outer circumferential surface of a (non-diagrammed) socket in a light fixture. Also, as shown in FIG. 10B, the inner circumferential surface of the base 30 has a female helix portion 34 for screwing in the case 60. The base 30 is made of metal or a similar electrically conductive material. In the present Embodiment, the base 30 is an E26 Edison screw base. However, the base 30 is not limited to being an E26 Edison screw base, but may also be an E17 base or another type of base. Further, the base 30 need not necessarily be a screw-in base, but may instead be another type of base such as an insertion base.

The stem 40 supports the light-emitting module. As shown in FIG. 10A, the stem 40 is generally baculiform, extending from the vicinity of the opening of the globe 10 toward the interior of the globe 10. Also, as shown in FIG. 10B, the stem 40 has an end portion 40a, which is a longitudinal end thereof arranged within the globe 10, having a flat portion 41a for mounting the light-emitting module 1. A protrusion 41b protruding in the extension direction of the stem 40 is provided at the approximate centre of the flat portion 41a. The light-emitting module 1 is fixed to the end portion 40a of the stem 40 such that the protrusion 41b is inserted into through-hole 114 of the substrate 110. As such, a surface of the substrate 110 in the light-emitting module 1 opposite the face on which the substrate LED chips 120 are mounted is in contact with the flat portion 41a of the end portion 40a on the stem 40.

The stem 40 is made of aluminium of a similar metal material having relatively high thermal conductivity. However, the stem 40 is not limited to being formed of metal, but may also be formed of ceramic or another material having relatively high thermal conductivity. Thus, the stem 40 is made of a material having relatively high thermal conductivity and as such, the heat produced by the light-emitting module 1 is easily transmitted through the stem 40 to the base 30 and the globe 10. As a result, deterioration in light-emitting efficacy and diminution in longevity caused by temperature increases can be constrained for the LED chips 120.

Also, another end portion 40b at the other longitudinal end of the stem 40 is generally shaped as a circular frustum. The other end portion 40b has formed therein two insertion holes 40b1 and 40b2 for inserting the leads 70a and 70b therein.

The substrate 110 of the light-emitting module 1 and the stem 40 are fixed using an adhesive (non-diagrammed) made of silicone resin. The adhesive may be, for example, made of a material having high thermal conductivity due to the dispersal of metal microparticles within the silicone resin.

As shown in FIG. 10A, the support member 50 is arranged so as to block the opening of the globe 10. The support member 50 is inserted into the case 60 and fixed. The stem 40 is, in turn, fixed to the end of the support member 50 that is arranged in the globe 10. The support member 50 and the stem 40 are fixed in place using screws. The support member 50 is a generally circular disc having a circumferential surface that is in contact with the inner circumference of the case 60. Also, a through-hole 52 is formed at the approximate centre of the support member 50 so as to pass the leads 70a and 70b therethrough. Then, as shown in FIG. 10B, the leads 70a and 70b originating at the power source circuit 80 pass through the through-hole 52 in the support member 50 and through the insertion holes 40b1 and 40b2 in the other end 40b of the stem 40, extending to the light-emitting module 1 and being electrically connected to the wiring pattern 130 of the light-emitting module 1.

A step portion 52a is formed at the circumference of the support member 50, and the edge of the opening of the globe 10 is in contact with the step portion 52a. The support member 50, the case 60, and the edge of the opening of the globe 10 are affixed to the step portion 52a by introducing an adhesive into a gap formed between the step portion 52a and the inner wall of the case 60. The support member 50 is formed of aluminium or another metal material. However, the support member 50 is not limited to being formed of metal, but may also be formed of ceramic or another material. The adhesive used for fixing the support member 50, the case 60, and the globe 10 is, for example, a silicone resin having metal microparticles dispersed throughout.

Given that the support member 50 is made of a material having high thermal conductivity, heat is transferred from the light-emitting module 1 to the stem 40 and is effectively transmitted to the support member 50. Also, given that the support member 50 is connected to the globe 10, the heat transferred to the support member 50 is further transferred to the globe 10 and dissipated to the atmosphere from the exterior surface of the globe 10. As a result, deterioration in light-emitting efficacy and diminution in longevity caused by temperature increases can be constrained for the LED chips 120. Further, given that the support member 50 is connected to the case 60, the heat transferred to the support member 50 from the light-emitting module 1 is also dissipated to the atmosphere from the exterior surface of the case 60.

The case 60 is made of a resin material that does not conduct electricity, and thus insulates the stem 40 and the base 30 while containing the power source circuit 80. The non-conducting resin material is, for example, polybutylene terephtalate (hereinafter, PBT) that includes glass fibres. As shown in FIG. 10B, the case 60 includes a main portion 61 that is cylindrical and is arranged near the stem 40, and a base attach portion 62 that is also cylindrical, is continuous with the main portion 61, and has the base 30 enmeshed therewith.

The main portion 61 has an inner diameter that is almost equal to the outer diameter of the support member 50. The support member 50 is then fit into the main portion 61 and fixed, such that the inner circumferential surface of the main portion 61 is partially in contact with the circumferential surface of the support member 50. Given that the outer surface of the main portion 61 is exposed to the atmosphere, the heat transferred to the case 60 is primarily dissipated therethrough.

The base attach portion 62 includes a male helix portion 64 that can be screwed into the female helix portion 34 formed on the inner circumferential surface of the base 30. The base 30 is fit onto the base attach portion 62 by screwing the male helix portion 64 into the female helix portion 34 of the base 30, such that the outer circumferential surface of the base attach portion 62 is in contact with the base 30. The heat transferred to the case 60 is then transmitted through the base attach portion 62 to the base 30 and thus dissipated from the outer surface of the base 30.

As shown in FIG. 10B, the power source circuit 80 is a circuit supplying electric power to the light-emitting module 1, and is contained within the case 60. Specifically, the power source circuit 80 includes a plurality of circuit elements 80a and a circuit board 80b on which the circuit elements 80a are mounted. The power source circuit 80 converts the power received from the base 30 from alternating current to direct current and supplies the direct current to the light-emitting module 1 via the two leads 70a and 70b.

Embodiment 5

The following describes a light-emitting module 1001 pertaining to Embodiment 3 having a lamp (hereinafter, lamp unit) 2001 pertaining to the present Embodiment.

Figure 11:
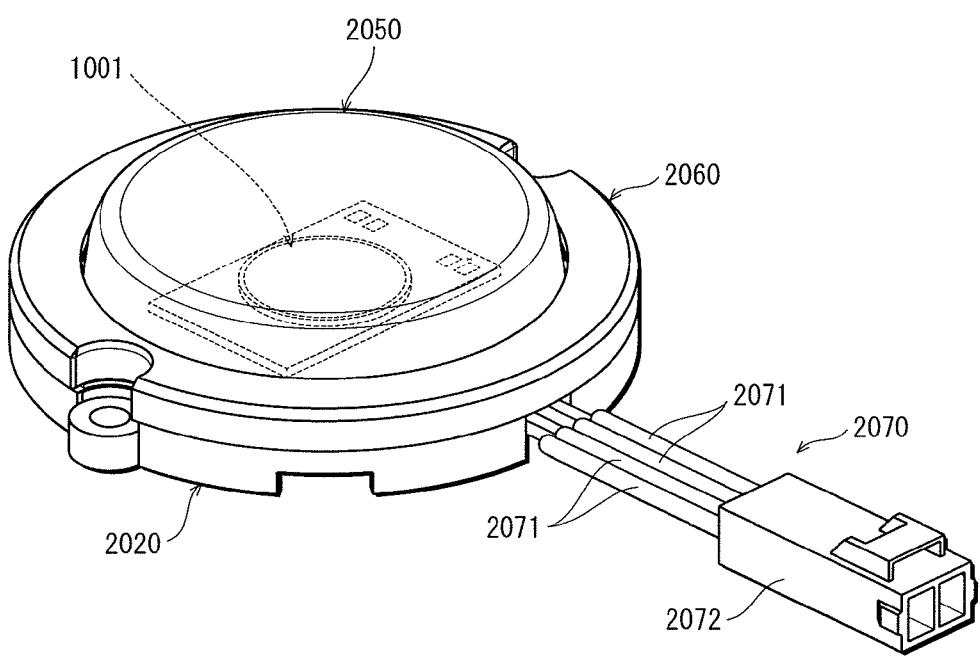
FIG. 11 shows a perspective view of a lamp unit pertaining to Embodiment 4.
Figure 12:
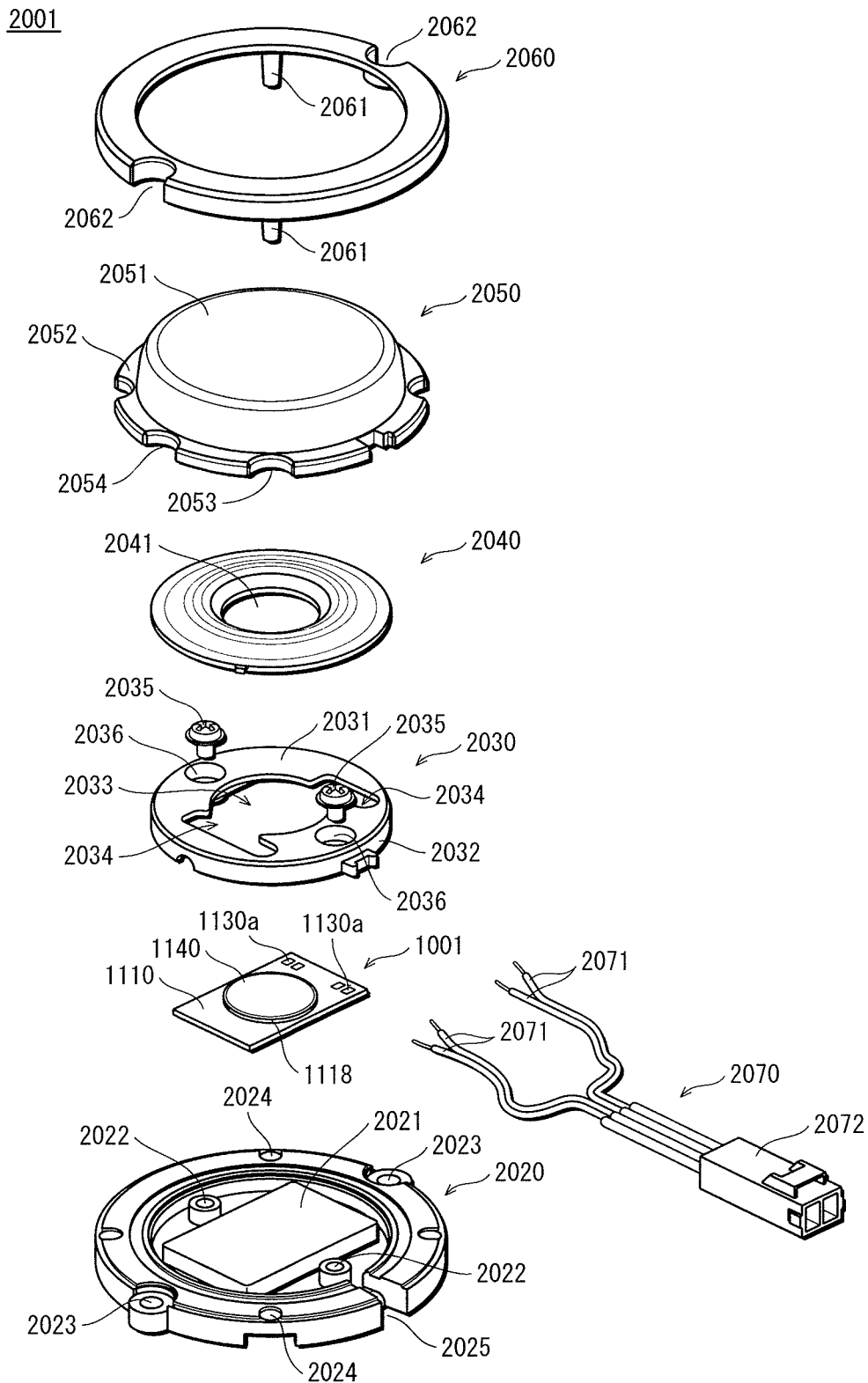
FIG. 12 shows an exploded view of the lamp unit pertaining to Embodiment 4.

FIG. 11 shows a perspective view of a lamp pertaining to the present Embodiment, and FIG. 12 shows an exploded view of the lamp unit 2001.

The lamp unit 2001 has the light-emitting module 1001 pertaining to Embodiment 1 mounted therein as a light source. In addition to the light-emitting module 1001, the lamp unit 2001 also includes a base 2020, a holder 2030, a dressing cover 2040, a cover 2050, a cover press member 2060, and a wiring member 2070.

The base 2020 is a round plate having a mount portion 2021 at the centre of the top face thereof. The light-emitting module 1001 is mounted on the mount portion 2021. A pair of screw holes 2022 are also provided on the top face of the base 2020 on each side of the mount portion 2021, in order to screw in assembly screws 2035 that fix the holder 2030. The periphery of the base 2020 has insertion holes 2023, boss holes 2024, and a notch 2025. The respective roles of the insertion holes 2023, the boss holes 2024, and the notch 2025 are explained later. The base 2020 is, for example, made of a metal material such as aluminium die cast.

The holder 2030 is a bottomed cylinder having a round press plate 2031 and a circumferential wall 2032 that extends from the edge of the press plate 2031 toward the base 2020. The press plate 2031 presses the light-emitting module 1001 into the mount portion 2021 and thus fixes the light-emitting module 1001 onto the base 2020.

A window aperture 2033 is provided at the centre of the press plate 2031 to expose the sealing member 1140 of the light-emitting module 1001. Openings 2034 are formed at the periphery of the press plate 2031 and are continuous with the window aperture 2033. The openings 2034 are provided in order to prevent leads 2071 connected to the light-emitting module 1001 from interfering with the holder 2030. Further, insertion holes 2036 are provided at the edge of the press plate 2031 in the holder 2030 at positions corresponding to the screw holes 2022 of the base 2020, in order for the assembly screws 2035 to pass therethrough. The holder 2030 is affixed to the base 2020 by first sandwiching the light-emitting module 1001 between the base 2020 and the holder 2030 such that the sealing member 1140 of the light-emitting module 1001 is exposed through the window aperture 2033 in the holder 2030. Then, the assembly screws 2035 are made to pass through the insertion holes 2036 from the opposite side of the base 2020 with respect to the press plate 2031, and are screwed into the screw holes 2022 of the base 2020. Accordingly, the holder 2030 is affixed to the base 2020.

The dressing cover 2040 is annular and disposed between the holder 2030 and the cover 2050 so as to cover the leads 2071, the assembly screws 2035, and other components exposed through the openings 2034. Another window aperture 2041 is provided at the centre of the dressing cover 2040 to expose the sealing member 1140 of the light-emitting module 1001. The dressing cover 2040 is made of a non-transparent material, such as a white resin that is not transmissive.

The cover 2050 is approximately shaped as a dome having a main portion 2051 that covers the sealing member 1140, and an outer flange 2052 extending from the edge of the main portion 2051 toward the exterior. The outer flange 2052 is fixed to the base 2020. The cover 2050 is, for example, made of silicone resin, acrylic resin, glass, or some other optically transmissive material. Light radiating from the sealing member 1140 thus passes through the cover 2050 to the exterior of the lamp unit 2001.

The cover press member 2060 is made of aluminium or a similar metal material, of a white resin that is not optically transmissive, or of a similarly non-transparent material. As such, the light radiating from the main portion 2051 of the cover 2050 is unobstructed in passing through the annular portion. The outer flange 2052 of the cover 2050 is fixed in place between the cover press member 2060 and the base 2020.

The cover press member 2060 has columnar bosses 2061 protruding toward the base 2020. A semicircular notch 2053 is provided in the outer flange 2052 of the cover 2050 at a position corresponding to each boss 2061 in order to exclude the bosses 2061. Furthermore, the boss holes 2024 are provided at the edge of the base 2020 at positions corresponding to the bosses 2061, in order to allow the bosses 2061 to pass therethrough. The cover press member 2060 is affixed to the base 2020 as follows. The bosses 2061 of the cover press member 2060 are made to pass through the boss holes 2024 of the base 2020. Then, the tips of the bosses 2061 opposite the cover press member 2060 with respect to the base 2020 are then irradiated with a laser to cause elastic deformation, thus preventing the tips from escaping the boss holes 2024. Accordingly, the cover press member 2060 is affixed to the base 2020.

Semicircular notches 2054 and 2062 are respectively formed at positions corresponding to the insertion holes 2023 of the base 2020 in the outer flange 2052 of the cover 2050 and in the edge of the cover press member 2060. Thus, (non-diagrammed) attachment screws are able to pass through the insertion holes 2023 without touching the cover press member 2060 or the cover 2050.

The wiring member 2070 has a pair of leads 2071 that are electrically connected to the light-emitting module 1001, and are attached to a connector 2072 at ends opposite the ends connected to the light-emitting module 1001. The leads 2071 of the wiring member 2070 connected to the light-emitting module 1001 lead to the outside of the lamp unit 2001 via the notch 2025 of the base 2020.

Embodiment 6

Figure 13:
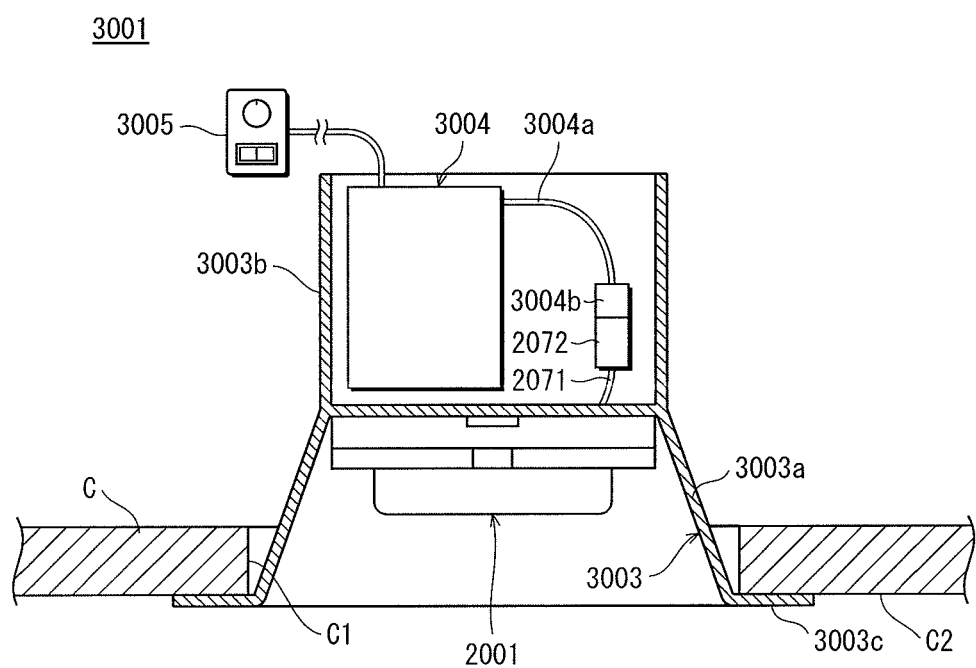
FIG. 13 shows a cross-section of a lighting apparatus pertaining to Embodiment 5.

FIG. 13 shows a perspective view of a lighting apparatus 3001 pertaining to the present Embodiment.

The lighting apparatus 3001 is a downlight installed into a ceiling C, and includes a fixture 3003, a circuit unit 3004, a dimmer unit 3005, and the lamp unit 2001 described in Embodiment 5.

The fixture 3003 includes a lamp container 3003a, a circuit container 3003b, and an outer flange 3003c. The fixture 3003 is, for example, made of a metal material such as aluminium die cast. The lamp container 3003a is a bottomed cylinder that is removably mounted in the lamp unit 2001. The circuit container 3003b extends from the bottom of the lamp container 3003a and contains the circuit unit 3004. The outer flange 3003c is annular and extends outward from the opening of the lamp container 3003a. The fixture 3003 is embedded in an embedding hole C1 provided in the ceiling C for the lamp container 3003a and the circuit container 3003b. The outer flange 3003c is affixed to the ceiling C using (non-diagrammed) attachment screws, for example, so as to be in contact with the edge of the embedding hole C1 at the underface C2 of the ceiling C.

The circuit unit 3004 has a power line 3004a electrically connected to the lamp unit 2001 in order to light the lamp unit 2001. The tip of the power line 3004a is attached to a connector 3004b that is removably connected to the connector 2072 of the leads 2071 of the lamp unit 2001. Although the lighting apparatus 3001 is described as having the lamp unit 2001 and the circuit unit 3004 as separate units, the circuits of the circuit unit 3004 may also be mounted within the lamp unit.

The dimmer unit 3005 is provided in order to allow the user to adjust the colour temperature of the light from the lamp unit 2001. The dimmer unit 3005 is electrically connected to the circuit unit 3004, receives user operations, and outputs a dimmer signal to the circuit unit 3004.

In the present Embodiment, the lighting apparatus 3001 is described as having the lamp unit of Embodiment 5 mounted therein. However, the lighting apparatus pertaining to the present Embodiment is not limited in this manner, and may also, for example, have a lighting apparatus mounted therein that includes the lamp 100 of Embodiment 4.

(Variations)

(1) The light-emitting module 1 pertaining to Embodiment 1 is described in an example where the heat transfer member 160 is only in contact with the side walls of the LED chips 120. However, no such limitation is intended.

Figure 14A:
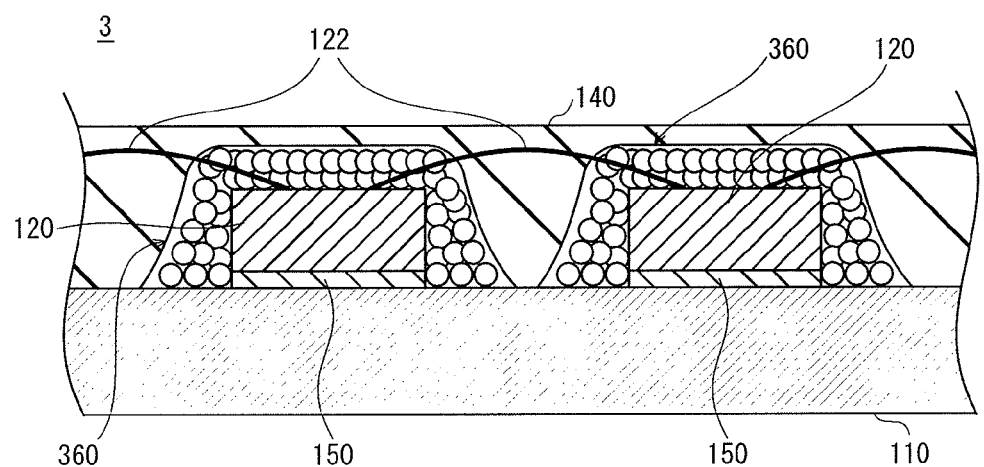
FIGS. 14A and 14B show a partial cross-section of a light-emitting module pertaining to a variant.

For example, as shown in FIG. 14A, a light-emitting module 3 may have a heat transfer member 360 that is disposed so as to cover the surface (i.e., top face) of the LED chips 120 opposite the face (i.e., bottom face) that is on the die attach member 150, in addition to the side walls. Thus, the heat transfer member 360 is in contact with the top face of the LED chips 120.

Also, the light-emitting module 1 pertaining to Embodiment 1 is described in an example where the heat transfer members 160 disposed at the outer circumferential area of a pair of neighbouring LED chips 120 are not in contact with one another. However, no such limitation is intended. For example, the heat transfer members 160 disposed at the outer circumferential areas of a pair of neighbouring LED chips 120 may be in contact.

Figure 14B:
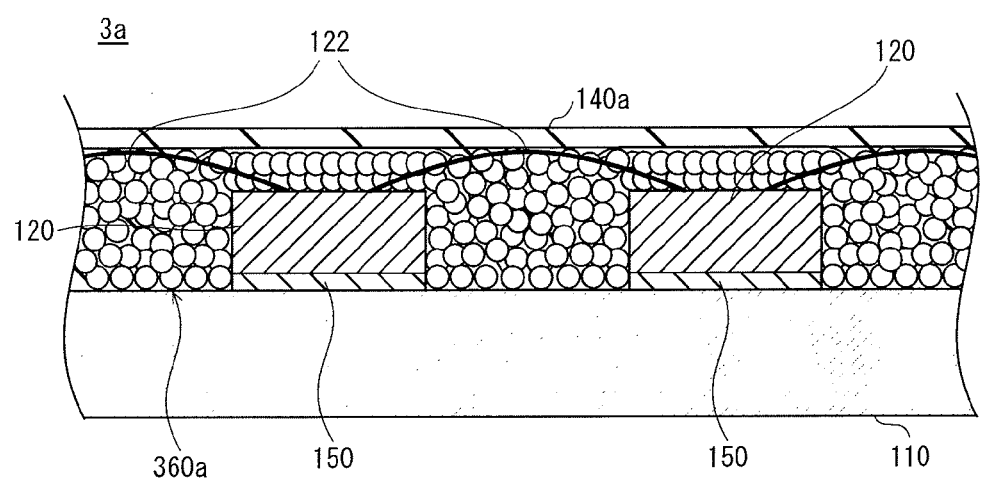

Furthermore, as shown in FIG. 14B, a light-emitting module 3a may be configured such that a heat transfer member 360a fills an area between the substrate 110 and the sealing member 140a in which the LED chips 120 and so on are disposed.

(2) The light-emitting module 1 pertaining to Embodiment 1 is described in an example where the die attach member 150 is made of a silicone resin adhesive. However, no such limitation is intended.

Figure 15:
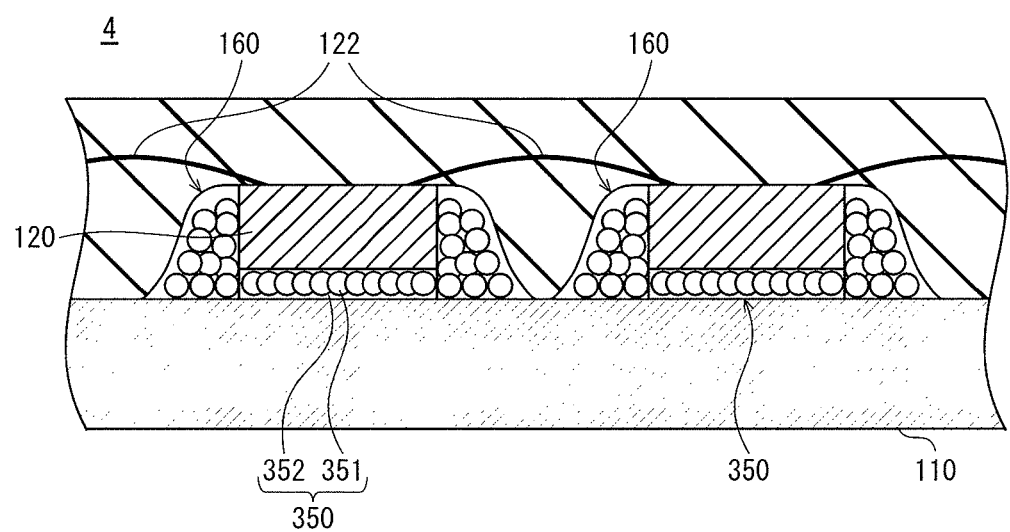
FIG. 15 shows a partial cross-section of a light-emitting module pertaining to a variant.

For example, as shown in FIG. 15, a light-emitting module 4 may have a die attach member 350 made from an adhesive that includes microparticles 351 and the nanocomposite 352.

(3) The light-emitting module 1 pertaining to Embodiment 1 is described in an example where the sealing member 140 is provided so as to seal the LED chips 120 and the heat transfer member 160. However, no such limitation is intended.

Figure 16A:
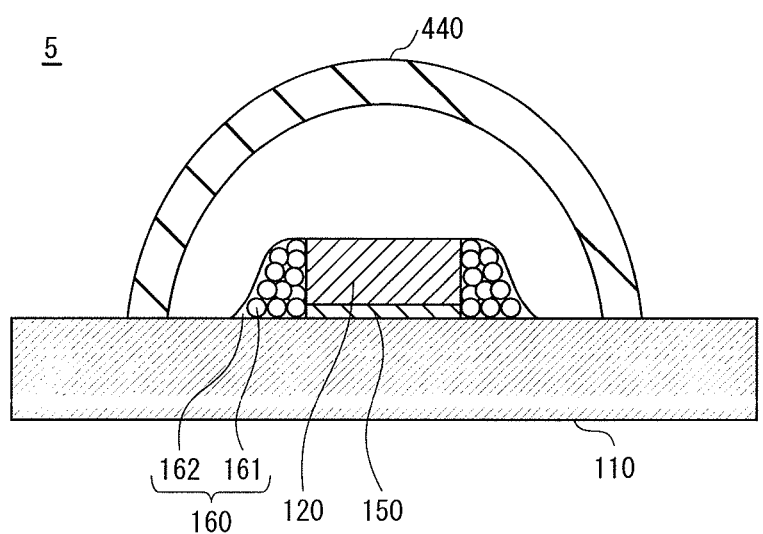
FIGS. 16A and 16B show a partial cross-section of a light-emitting module pertaining to a variant.

For example, as shown in FIG. 16A, a light-emitting module 5 may have a hollow sealing member 440 where a gap is provided between the inner circumferential surface of the sealing member 440, the LED chips 120, and the heat transfer member 160.

(4) The light-emitting module 1 pertaining to Embodiment 1 is described in an example where COB LED chips 120 are used. However, no such limitation is intended.

Figure 16B:
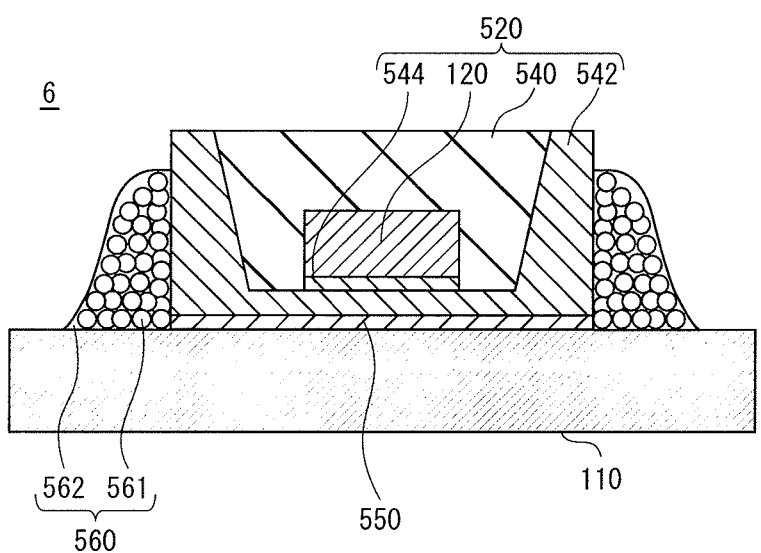

For example, as shown in FIG. 16B, a light-emitting module 6 may use surface-mounted LEDs 520. Such LEDs 520 each include a package 542 made of polycrystalline alumina (hereinafter, PCA) or a similar transparent material, the LED chips 120 mounted in the package 542 using an adhesive member such as solder, and a sealing member 540 sealing the interior of the package 542. In such a case, as shown in FIG. 16B, the side walls of the package 542 are in contact with the heat transfer member 560, such that the heat transferred from the LED chips 120 to the package 542 is, in turn, transferred to the substrate 110 via the heat transfer member 560 and the die attach member 550. That is, the main surface of the substrate 110 and the bottom faces of the LED chips 120 are thermally connected via the package 542 and the heat transfer member 560. The heat transfer member 560 is made up of microparticles 561 and a nanocomposite 562.

Figure 17:
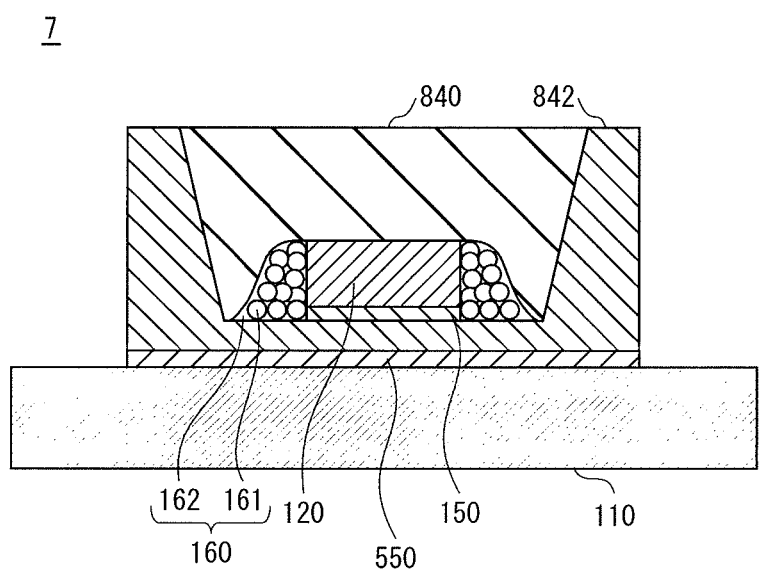
FIG. 17 shows a partial cross-section of a light-emitting module pertaining to a variant.

Also, as shown in FIG. 17, a light-emitting module 7 may be fixed in a package 842 by the die attach member 150 and the heat transfer member 160, and the package 842 is sealed by a sealing member 840. Here, the package 842 is fixed to the substrate 110 by an adhesive 750.

(5) In Embodiment 3, the heat transfer member 160 is described as being arranged such that the electrodes of the LED chips 120 and a portion of the land portions 1130b and metal wires 1122 forming the wiring pattern are not covered thereby. However, no such limitation is intended. A portion of the heat transfer member may cover the aforementioned portion of the land portions 1130b.

Figure 18A:
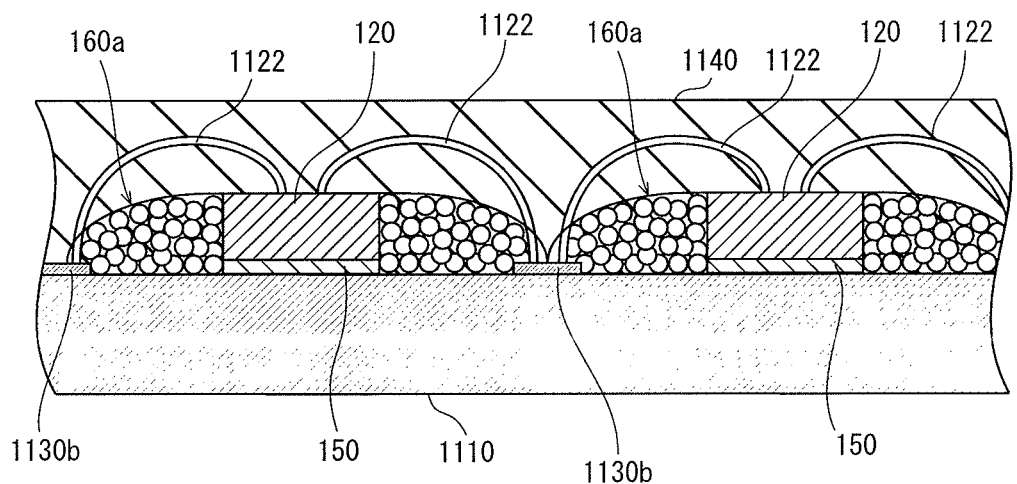
FIGS. 18A and 18B show a partial cross-section of a light-emitting module pertaining to a variant.
Figure 18B:
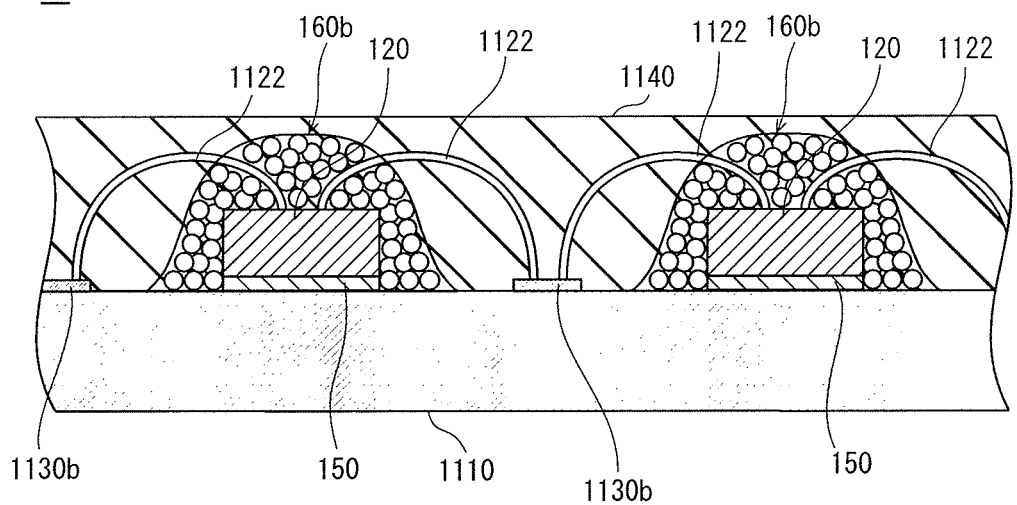
Figure 19:
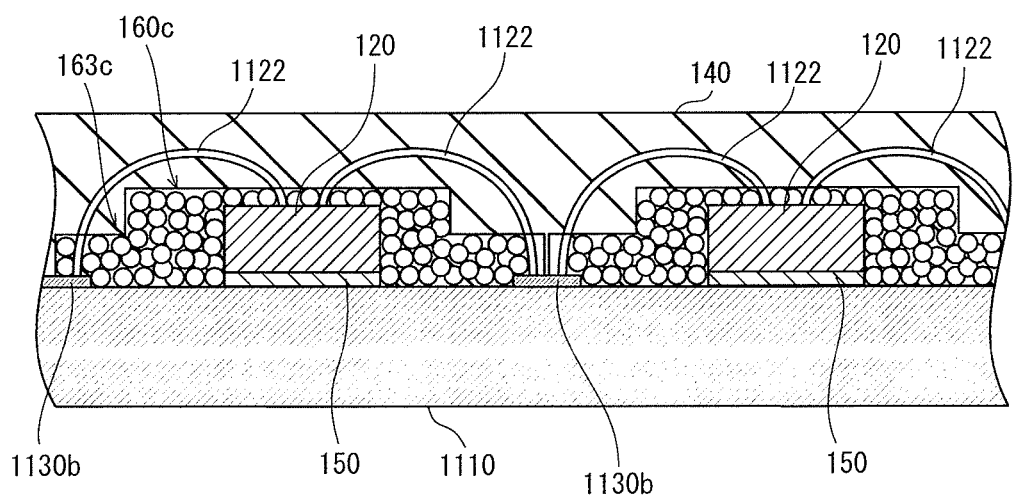
FIG. 19 shows a partial cross-section of a light-emitting module pertaining to a variant.

FIGS. 18A, 18B, and 19 each show cross-sections of variant light-emitting modules 8a, 8b, and 8c.

As shown in FIG. 18A, a light-emitting module 8a may have the electrodes of the LED chips 120 uncovered by the heat transfer member 160a while the portion of the land portions 1130b are covered by the heat transfer member 160a.

According to this configuration, the heat produced by the LED chips 120 is dissipated toward the substrate 1110 via the land portions 1130b, which have good heat transfer properties.

As shown in FIG. 18B, a light-emitting module 8b may have the electrodes of the LED chips 120 covered by the heat transfer member 160b while the portion of the land portions 1130b are not covered by the heat transfer member 160b.

According to this configuration, the heat produced by the LED chips 120 is dissipated toward the substrate 1110 via the electrodes of the LED chips 120 themselves as well as the heat transfer member 160b.

As shown in FIG. 19, a light-emitting module 8c may have a heat transfer member 160c cover the electrodes of the LED chips 120 and the portion of the land portions 1130b. The heat transfer member 160c has a step portion 163c formed at the outer circumferential surface thereof.

According to this configuration, the heat produced by the LED chips 120 is dissipated toward the substrate 1110 via the land portions 1130b, which have good heat transfer properties, and via the electrodes of the LED chips 120 themselves as well as the heat transfer member 160c.

In addition, the manufacturing process for the light-emitting module pertaining to the present disclosure may include an additional step of heating the entirety of the substrate in order to apply thermal curing to the heat transfer member. Accordingly, the stress applied to the metal wires 1122 when thermal curing is applied to the heat transfer member increases with increasing proportion of components embedded within the heat transfer member, including the metal wires 1122.

In contrast, the present configuration includes a step portion 163c provided in a part of the outer circumferential surface of the heat transfer member 160c. This reduces the proportion of components embedded within the heat transfer member 160c. As such, the stress applied to the metal wire 1122 during thermal curing of the heat transfer member 160c is decreased. This reduces the risk of problems such as breaking occurring in the metal wire 1122 during manufacturing.

(6) In Embodiment 3, the heat transfer member 160 is described in an example where the LED chips 120 are disposed so as to be individually surrounded. However, no such limitation is intended.

Figure 20A:
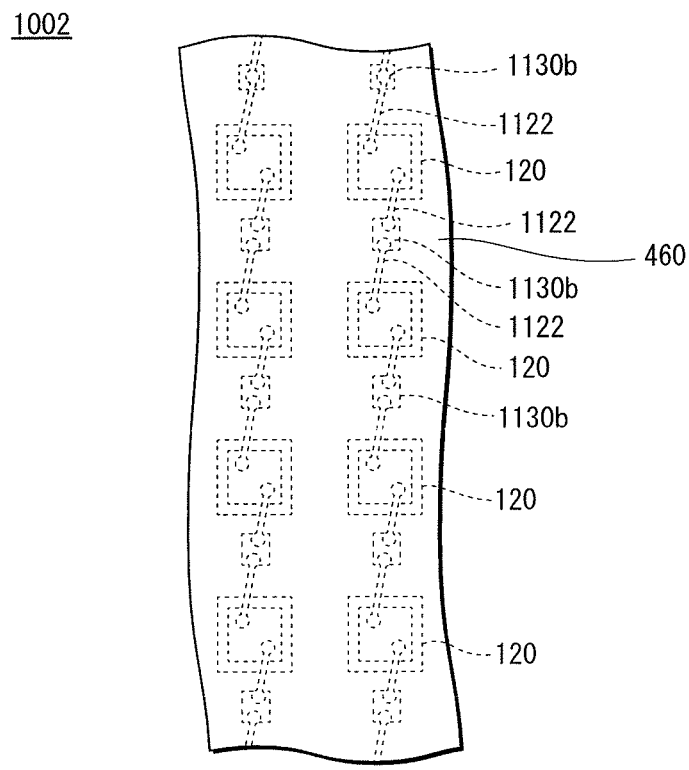
FIGS. 20A and 20B illustrate a light-emitting module pertaining to a variant, where
Figure 20B:
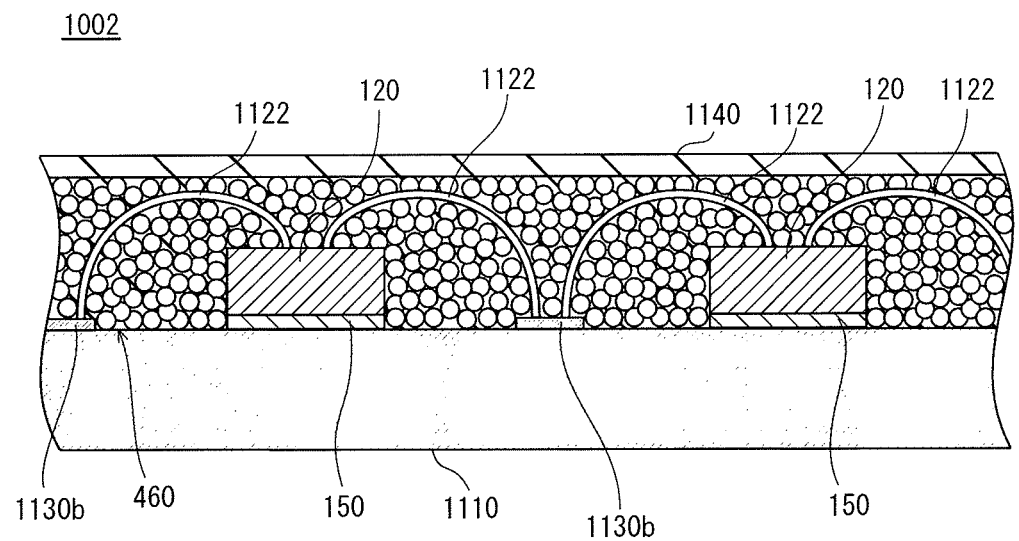

The light-emitting module 1002 pertaining to the present variation is shown with the sealing member 1140 partially removed, in a plan view in FIG. 20A and in a partial cross-section in FIG. 20B. A full plan view of the light-emitting module 1002 is shown in FIG. 9A and has previously been described in Embodiment 3. Components identical to those of Embodiment 3 use the same reference signs thereas, and explanations thereof are omitted.

The light-emitting module 1002 has a heat transfer member 460 filling the area between the substrate 1110 and the sealing member 1140 where the LED chips 120 and so on are disposed. Accordingly, the heat transfer member 460 suffices to entirely cover the outer circumferential area of each LED chip 120 on the substrate 110 and the top face of all the LED chips 120.

According to this configuration, the heat produced by the LED chips 120 is dissipated toward the substrate 1110 via the land portions 1130b, which have good heat transfer properties, and via the electrodes of the LED chips 120 themselves as well as the heat transfer member 460.

Also, according to this configuration, the material (i.e., the liquid mixture of nanocomposite and microparticles) used as the base for the heat transfer member 460 may be simply applied to the entirety of the region where the LED chips 120 are disposed on the substrate 1110. As such, the configuration is simplified relative to that of the light-emitting module 1001 described in Embodiment 3.

Figure 21A:
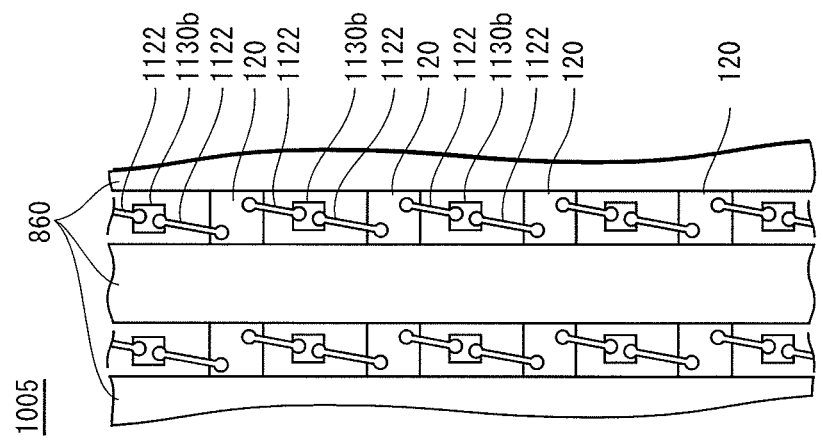
FIGS. 21A, 21B, and 21C show a partial cross-section of a light-emitting module pertaining to a variant.
Figure 21B:
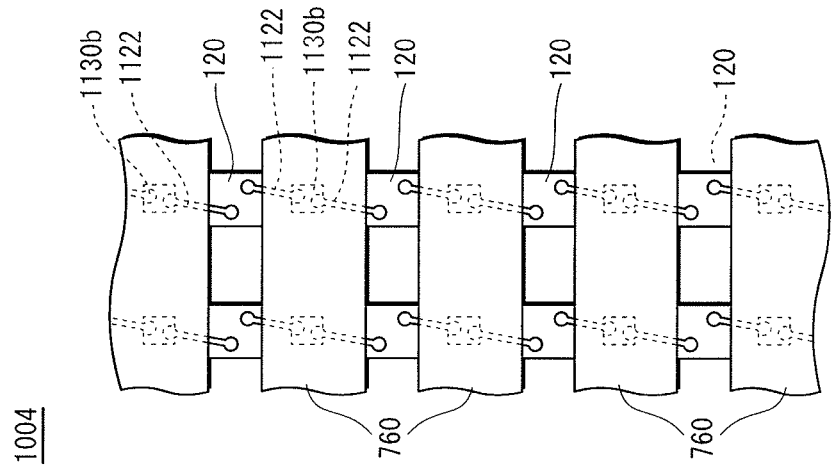

Further, FIGS. 21A and 21B illustrate an alternate configuration pertaining to the present variation for light-emitting modules 1003, 1004, and 1005. A full plan view of the light-emitting modules 1003, 1004, and 1005 is shown in FIG. 9A and has previously been described in Embodiment 3. Components identical to those of Embodiment 3 use the same reference signs thereas, and explanations thereof are omitted.

As shown in FIG. 21A, the light-emitting module 1003 has a heat transfer member 660 that is formed into bands and disposed on the main surface of the substrate 1110 in a region that includes the entire outer circumferential area of each LED chip 120 aligned horizontally, and also covers the top face of the same LED chips 120. In other words, the heat transfer member 660 entirely covers the outer circumferential area and the top face of the LED chips 120 that are disposed in a horizontal unit.

Accordingly, the heat transfer member 660 is arranged so as to cover the electrodes of the LED chips 120 while not covering the land portions 130b.

According to this configuration, the material (i.e., the liquid mixture of nanocomposite and microparticles) used as the base for the heat transfer member 660 may be simply applied in bands to the region where the LED chips 120 are disposed on the substrate 1110. As such, the configuration is simplified relative to that of the light-emitting module 1001 described in Embodiment 3, in which application is performed on the LED chips 120 individually.

Also, according to this configuration, the heat produced by the LED chips 120 is additionally dissipated through the heat transfer member 160b toward the substrate 1110, and corresponding improvements to heat transfer characteristics are provided that constrain light efficacy diminution in the LED chips 120.

Furthermore, according to this configuration, the proportion of the metal wire 1122 embedded in the heat transfer member 660 is reduced in contrast to FIGS. 20A and 20B. As such, with respect to the light-emitting module 1003 manufacturing process, the stress applied to the metal wire 1122 during thermal curing of the heat transfer member 660 is decreased. This reduces the risk of problems such as breaking occurring in the metal wire 1122 during manufacturing.

As shown in FIG. 21B, the light-emitting module 1004 is configured almost identically to that shown in FIG. 21A. However, a point of difference from FIG. 21A exists in that the heat transfer member 760 covers the land portions 130b while leaving the electrodes of the LED chips 120 uncovered. As such, the heat transfer member 760 is disposed in band regions that extend along the alignment direction of a pair of neighbouring LED chips 120 with respect to the vertical direction.

According to this configuration, the material (i.e., the liquid mixture of nanocomposite and microparticles) used as the base for the heat transfer member 760 may be simply applied in bands to the region where the LED chips 120 are disposed on the substrate 1110. As such, the configuration is simplified in comparison to that of the light-emitting module 1001 described in Embodiment 3.

Also, according to this configuration, the heat produced by the LED chips 120 is dissipated through the land portions 1130b, which have good heat transfer properties, toward the substrate 1110, and corresponding improvements to heat transfer characteristics are provided that constrain light efficacy diminution in the LED chips 120.

Furthermore, according to this configuration, the proportion of the metal wire 1122 embedded in the heat transfer member 760 is reduced in contrast to FIGS. 20A and 20B. As such, with respect to the light-emitting module 1003 manufacturing process, the stress applied to the metal wire 1122 during thermal curing of the heat transfer member 760 is decreased. This reduces the risk of problems such as breaking occurring in the metal wire 1122 during manufacturing.

Figure 21C:
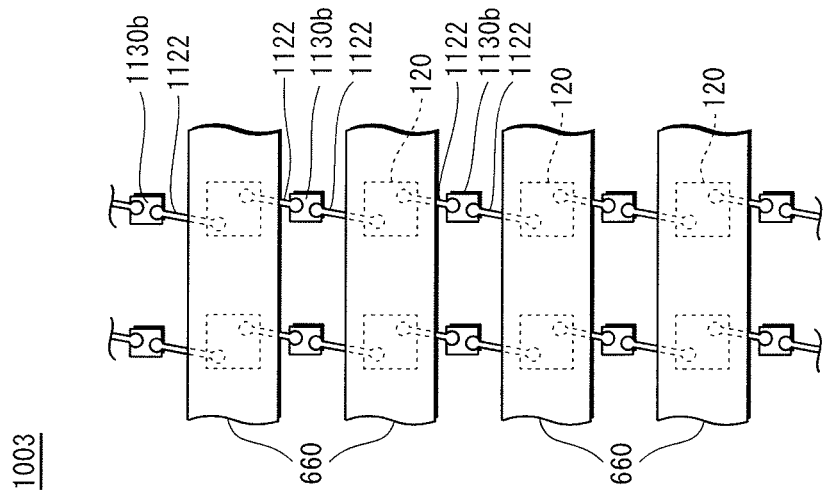

As shown in FIG. 21C, a light-emitting module 1005 has a heat transfer member 860 disposed on the main surface of the substrate 1110 so as to include part of an outer circumferential area positioned at both sides of each row of semiconductor light-emitting elements aligned in a vertical direction, and so as to extend vertically in bands. Also, the heat transfer members 860 are arranged such that the electrodes of the LED chips 120, the land portions 130b, and the metal wires 1122 forming the wiring pattern are not covered thereby.

According to this configuration, the material (i.e., the liquid mixture of nanocomposite and microparticles) used as the base for the heat transfer member 860 may be simply applied in bands to the region where the LED chips 120 are disposed on the substrate 1110. As such, the configuration is simplified relative to that of the light-emitting module 1001 described in Embodiment 3, in which application is performed on the LED chips 120 individually.

Also, unlike FIGS. 20A, 20B, 21A, and 21B, the present configuration has the metal wires 1122 remain uncovered by the heat transfer member 860. Accordingly, during the light-emitting module 1003 manufacturing process, the thermal shrinkage of the heat transfer member 860 during thermal curing does not affect the metal wires 1122. Thus, the risk of breakage or other damage to the metal wires 1122 during manufacturing is further constrained.

Figure 22:
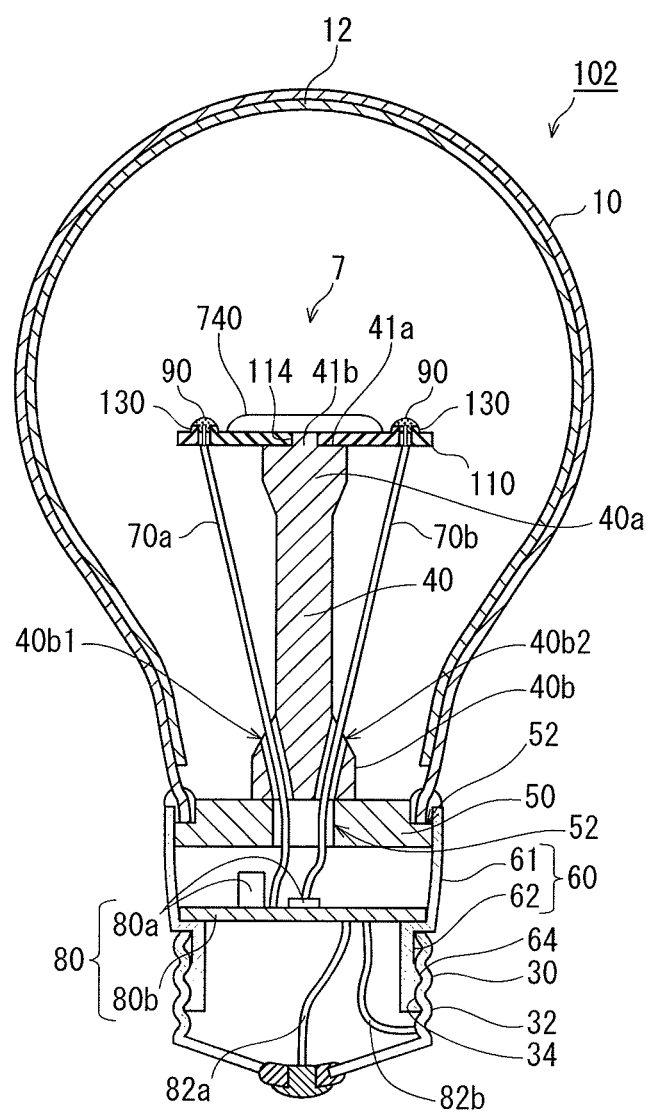
FIG. 22 shows a cross-section of a lamp pertaining to a variant.

(7) In Embodiment 4, an example is described of a lamp 100 using a light-emitting module 1 having a sealing member 140 that serves as a wavelength conversion member. However, no such limitation is intended. For example, as shown in FIG. 22, a light-emitting module 7 having a sealing member 740 that does not include fluorescent particles may be used, and the lamp 102 may be provided with a wavelength conversion member 12 that includes fluorescent particles and is disposed at the inner circumferential surface of the globe 10. FIG. 22 uses the same basic configuration and the same reference signs as Embodiment 3.

(8) The respective light-emitting modules 1, 2, and 1001 described in Embodiments 1, 2, and 3 are all described in examples where the sealing member includes fluorescent particles and thus functions as a wavelength conversion member. However, no such limitation is intended. The sealing member need not necessarily include fluorescent particles. According to this configuration, the sealing member does not serve as a wavelength conversion member and the light radiating from the LED chips is radiated out through the sealing member without undergoing wavelength conversion therein.

LIST OF REFERENCE SIGNS

1, 2, 3, 4, 5, 6, 7 Light-emitting module
10 Globe
12 Wavelength conversion member
30 Base
40 Heat sink
50 Support member
60 Case
70*a*, 70*b* Leads
80 Power source circuit
82*a*, 82*b* Power lines
100, 102 Lamp
110 Substrate
112, 114 Through-holes
120 LED chips
122, 124 Metal wire
130 Wiring pattern
130*a* Land portions
130*b* Leg parts
140, 640 Sealing member
150 Die attach member
160 Heat transfer member
161, 351 Microparticles
162 Nanocomposite

The invention claimed is:

1. A light-emitting module, comprising:
   a substrate;
   at least one semiconductor light-emitting element arranged on a main surface of the substrate; and
   a heat transfer member thermally connecting at least a portion of an outer circumferential surface of the semiconductor light-emitting element with the main surface of the substrate, and transferring heat produced by the semiconductor light-emitting element to the substrate, wherein
   the heat transfer member includes a base material that is optically transmissive, and particles of an optically transmissive material that are dispersed within the base material and have higher thermal conductivity than the base material, wherein
   the particles include first particles of a first type of optically transmissive material, and second particles of a second type of optically transmissive material,
   an average diameter of the first particles is greater than a wavelength of red light,
   an average diameter of the second particles is smaller than a wavelength of blue light, and
   the first type of optically transmissive material has higher thermal conductivity than the second type of optically transmissive material.

2. The light-emitting module of claim 1, wherein
   the first type of optically transmissive material is equal in terms of refractive index to a compound material made up of the base material with only the second particles dispersed therein.

3. The light-emitting module of claim 1, wherein
   the first type of optically transmissive material is a first inorganic compound, and
   the second type of optically transmissive material is a second inorganic compound that differs from the first inorganic compound.

4. The light-emitting module of claim 1, wherein
   the average diameter of the first particles is 1 μm to 100 μm.

5. The light-emitting module of claim 1, wherein
   the average diameter of the second particles is no more than 450 nm.

6. The light-emitting module of claim 1, further comprising
   a wavelength conversion member disposed on the main surface of the substrate so as to cover the semiconductor light-emitting element, converting a wavelength of light radiating from the semiconductor light-emitting element.

7. The light-emitting module of claim 1, wherein
   the semiconductor light-emitting element is affixed to the main surface of the substrate via an adhesive, and
   the heat transfer member has lower thermal resistance than the adhesive.

8. The light-emitting module of claim 6, wherein
   the wavelength conversion member further covers the heat transfer member, and
   the heat transfer member has greater thermal conductivity than the wavelength conversion member.

9. The light-emitting module of claim 1, wherein
   the semiconductor light-emitting element has a bottom face arranged to face the main surface of the substrate, and
   the heat transfer member is arranged at an outer circumference of the semiconductor light-emitting element on the substrate, and is in contact with at least a portion of a side face of the semiconductor light-emitting element.

10. The light-emitting module of claim 9, wherein
    the heat transfer member further covers a top face of the semiconductor light-emitting element opposite the bottom face, and is in contact with at least a portion of the top face of the semiconductor light-emitting element.

11. The light-emitting module of claim 10, wherein
    the semiconductor light-emitting element is provided in plurality, and
    the heat transfer member entirely covers the outer circumference of each semiconductor light-emitting element and the entire top face of all semiconductor light-emitting elements.

12. The light-emitting module of claim 10, wherein
the semiconductor light-emitting element is arranged in plurality as a matrix on the main surface of the substrate, and
the heat transfer member covers the semiconductor light-emitting element in row units or in column units, thereby entirely covering the outer circumference of each semiconductor light-emitting element and the entire top face of all semiconductor light-emitting elements.

13. The light-emitting module of claim 9, wherein
the semiconductor light-emitting element is arranged in plurality as a matrix on the main surface of the substrate, and
the heat transfer member is arranged so as to cover a band region on the main surface of the substrate, the band region extending in an alignment direction of the semiconductor light-emitting elements in two neighbouring rows or columns.

14. The light-emitting module of claim 9, wherein
the semiconductor light-emitting element has an electrode on a top face thereof,
a wiring pattern is formed on the main surface of the substrate, and includes a land portion that is separate from the semiconductor light-emitting element,
the electrode and the land portion are electrically connected via a metal wire, and
the metal wire is at least partially arranged outside the heat transfer member.

15. The light-emitting module of claim 1, wherein
the particles include nanoparticles having an average diameter of no more than 450 nm, and microparticles having an average diameter of 1 µm to 100 µm.

16. A lamp, comprising
the light-emitting module of claim 1.

17. A lighting apparatus, comprising
the lamp of claim 16.

18. A lamp, comprising:
a light-emitting module including:
   a substrate;
   a semiconductor light-emitting element arranged on a main surface of the substrate; and
   a heat transfer member thermally connecting at least a portion of an outer circumferential surface of the semiconductor light-emitting element with the main surface of the substrate, and transferring heat produced by the semiconductor light-emitting element to the substrate;
a globe containing the light-emitting module therein; and
a wavelength conversion member arranged within the globe, converting a wavelength of light radiating from the semiconductor light-emitting element, wherein
the heat transfer member includes a base material that is optically transmissive, and particles of an optically transmissive material that are dispersed within the base material and have higher thermal conductivity than the base material, wherein
the particles include first particles of a first type of optically transmissive material, and second particles of a second type of optically transmissive material,
an average diameter of the first particles is greater than a wavelength of red light,
an average diameter of the second particles is smaller than a wavelength of blue light, and
the first type of optically transmissive material has higher thermal conductivity than the second type of optically transmissive material.

\* \* \* \* \*